US007584079B2

(12) United States Patent
Lichtenberg et al.

(10) Patent No.: US 7,584,079 B2
(45) Date of Patent: Sep. 1, 2009

(54) METHOD OF CONFIGURING A PRODUCT

(75) Inventors: Jakob Lichtenberg, Charlottenlund (DK); Henrik Reif Andersen, Bagsvaerd (DK); Henrik Hulgaard, Copenhagen (DK); Jesper Møller, Copenhagen (DK); Anders Steen Rasmussen, Lyngby (DK)

(73) Assignee: Configit Software A/S, Copenhagen (DK)

( * ) Notice: Subject to any disclaimer, the term of this patent is extended or adjusted under 35 U.S.C. 154(b) by 996 days.

(21) Appl. No.: 09/996,745

(22) Filed: Nov. 30, 2001

(65) Prior Publication Data

US 2002/0165701 A1 Nov. 7, 2002

Related U.S. Application Data

(60) Provisional application No. 60/251,862, filed on Dec. 8, 2000.

(51) Int. Cl.
*G06F 17/00* (2006.01)
(52) U.S. Cl. .................. 703/2; 703/1; 703/7; 706/47; 707/1; 707/3; 707/5; 707/7
(58) Field of Classification Search .................. 703/1, 703/2, 6, 7; 713/1; 715/694; 706/47; 707/1, 707/3, 5, 7
See application file for complete search history.

(56) References Cited

U.S. PATENT DOCUMENTS

| 5,206,949 | A |   | 4/1993 | Cochran et al. |
| 5,297,150 | A | * | 3/1994 | Clark .......................... 714/26 |
| 5,446,883 | A | * | 8/1995 | Kirkbride et al. ............. 707/10 |
| 5,515,524 | A | * | 5/1996 | Lynch et al. .................. 703/13 |
| 5,522,073 | A |   | 5/1996 | Courant et al. |
| 5,523,942 | A | * | 6/1996 | Tyler et al. ..................... 705/4 |
| 5,604,892 | A |   | 2/1997 | Nuttall et al. |
| 5,675,724 | A |   | 10/1997 | Beal et al. |
| 5,675,784 | A |   | 10/1997 | Maxwell et al. |

(Continued)

FOREIGN PATENT DOCUMENTS

DE           39 11 465 C2      10/1990

(Continued)

OTHER PUBLICATIONS

Henric Reif Andersen, An Introduction to Binary Decision Diagrams, Oct. 1997, Dept. of Information Technology Technical University of Denmark.*

(Continued)

*Primary Examiner*—Kamini S Shah
*Assistant Examiner*—Kibrom K Gebresilassie
(74) *Attorney, Agent, or Firm*—Birch, Stewart, Kolasch & Birch, LLP

(57) ABSTRACT

A complex product is composed of several parts, where each part may depend on the other. As a consequence of these inter-dependencies, the selection of one part might exclude other parts from being included in the finished product. A consistent configuration is a selection of parts where all inter-dependencies are satisfied. A computer program for computer-assisted configuration helps an end-user to make choices that will lead to a consistent product. The preferred embodiment of the present invention, Virtual Tabulation, is a method for keeping track of inter-dependencies among a large number of parts, to allow for the construction of an efficient and exact configuration program. Such a program allows interactive configuration over networks (e.g., the Internet). Another aspect of the invention, called Smart Search, allows a set of inter-dependencies among parts to be computed from a product database.

38 Claims, 8 Drawing Sheets

U.S. PATENT DOCUMENTS

| | | | |
|---|---|---|---|
| 5,745,765 A | 4/1998 | Paseman | |
| 5,825,651 A * | 10/1998 | Gupta et al. | 700/103 |
| 5,844,554 A | 12/1998 | Geller et al. | |
| 5,873,081 A * | 2/1999 | Harel | 707/3 |
| 5,877,966 A | 3/1999 | Morris et al. | |
| 5,987,473 A | 11/1999 | Jorgensen | |
| 5,995,979 A | 11/1999 | Cochran | |
| 5,996,090 A * | 11/1999 | Hellerstein | 714/25 |
| 5,996,114 A | 11/1999 | Moeller | |
| 6,115,547 A | 9/2000 | Ghatate et al. | |
| 6,115,764 A * | 9/2000 | Chisholm et al. | 710/100 |
| 6,151,697 A | 11/2000 | Moeller | |
| 6,158,043 A | 12/2000 | Moeller | |
| 6,167,383 A * | 12/2000 | Henson | 705/26 |
| 6,192,355 B1 * | 2/2001 | Skovgaard | 706/47 |
| 6,223,170 B1 | 4/2001 | Skovgaard | |
| 6,230,200 B1 * | 5/2001 | Forecast et al. | 709/226 |
| 6,247,128 B1 * | 6/2001 | Fisher et al. | 713/100 |
| 6,272,390 B1 | 8/2001 | Skovgaard | |
| 6,275,821 B1 | 8/2001 | Danish et al. | |
| 6,300,948 B1 * | 10/2001 | Geller et al. | 715/866 |
| 6,343,313 B1 * | 1/2002 | Salesky et al. | 709/204 |
| 6,430,531 B1 * | 8/2002 | Polish | 704/257 |
| 6,567,814 B1 * | 5/2003 | Bankier et al. | 707/101 |
| 6,633,863 B1 * | 10/2003 | Sørensen Møller et al. | 707/2 |
| 7,062,478 B1 * | 6/2006 | Huelsman et al. | 706/47 |
| 7,171,400 B2 * | 1/2007 | Koubenski et al. | 707/3 |
| 7,440,955 B2 * | 10/2008 | Khandelwal et al. | 707/100 |
| 7,464,064 B1 * | 12/2008 | Smith | 706/47 |
| 2002/0065818 A1 * | 5/2002 | Starr | 707/5 |
| 2002/0073405 A1 * | 6/2002 | Chilimbi | 717/151 |
| 2002/0107763 A1 * | 8/2002 | Palmer et al. | 705/29 |
| 2003/0236707 A1 * | 12/2003 | Cheney | 705/26 |
| 2004/0181500 A1 * | 9/2004 | Huelsman et al. | 707/1 |
| 2004/0260667 A1 * | 12/2004 | Huelsman et al. | 706/47 |

FOREIGN PATENT DOCUMENTS

| | | |
|---|---|---|
| EP | 0 456 675 B1 | 9/1997 |
| EP | 0 770 239 B1 | 10/1998 |
| WO | WO 00/13113 | 3/2000 |

OTHER PUBLICATIONS

Henrick Reif Andersen, "An Introduction to Binary Decision Diagrams" Lecture notes for 49285 Advanced Algorithms E97, Oct. 1997,pp. 1-36.*

Definition of Directed Acyclic Graphs, copyright 1997, by Bruno R. Preiss, P. Eng., one page.*

J. Estublier, J. Favre, P. Morat, "Toward SCM/PDM Integration?" Spring-Verag Berlin Heidelberg 1998.*

H. Peltonen, T. Mannisto, R. Sulonen, K. Alho, "An Object Model for Evolutionary Configuration Management".*

A. V. D. Hoek, D. Heimbigner, and A. L. Wolf, "Does Configuration Management Research Have a Future?", pp. 305-309, 1995.*

H. Peltonen, T. Mannisto, R. Sulonen, and K. Alho, "An Object for Evolutionary Configuration Management", 1993.*

H. Peltonen, T. Mannisto, R. Sulonen, and K. Alho, "An Object for Evolutionary Configuration Management", pp. 1-18, 1993.*

Bradley, "Binary Decision Diagrams—A Functional Implementation," Nov. 2, 1997, 8 pages.

McMillan, "Symbolic Model Checking: An approach to the state explosion problem," May 1992, pp. 1-212.

* cited by examiner

METHOD OF CONFIGURING A PRODUCT

This application claims priority on provisional Application No. 60/251,862 filed on Dec. 8, 2000, the entire contents of which are hereby incorporated by reference.

FIELD OF THE INVENTION

The present invention generally relates to the task of configuring a product composed of several parts. The parts have inter-dependencies and as a consequence there are certain requirements regarding selection of the parts in order to build a working product. Generally, the process of determining whether a collection of parts will work together is a complex task and a computer program is often used to help solving this task. Such a computer program must work with the inter-dependencies in an efficient yet precise manner. This invention is related to how an implementation can be made of such a computer program.

BACKGROUND OF THE INVENTION

The invention relates to a method for performing a computer assisted product configuration.

A complex product is composed of several components. A product model of a complex product is often made by looking at the product as being composed of several generic components. For each of these components there is a group of specific alternatives.

An example of a product model of a bike is: A bike is build of the following components: a frame, a front wheel, a rear wheel and a gear set. The following alternatives for the frame component exists: carbon male, standard female, standard male, off-road. For the front wheel component: slick, off-road. For the rear wheel component: slick, off-road. And, finally, for the gear component: internal three speed, external 10 speed.

In the context of configuration the word "component" is not to be understood only as the generic description of a physical component. It could also be attributes such as colour and shape, parameters such as number of gears and horsepower. A component could also be understood as "need attributes", which express a need from the user of the configurator rather than a property of the product, such as the type of a bicycle (off-road, city bike, heavy duty bike etc.), the taste of a user (fashionable, classic, childish), or the price or weight or similar properties of interest for a user of a product.

A specific alternative must be selected for each of the components to build the complex product. A number of selections is called a partial configuration of the product. The complete selection of an alternative for each component is called a complete configuration (or just a configuration) of the product.

The number of possible configurations of the product grows rapidly with the number of components the product is composed of. For example, to configure the example bike, one must select among four frames, two front wheels, two rear wheels and two gears. Thus there exists 4×2×2×2=32 different configurations In realistic examples, this number quickly grows beyond millions.

Due to incompatibilities, etc., all combinations of the alternatives will not work. If we consider the bike example, it might be the case that the front and the rear wheel must be of the same type. Another requirement could be that the carbon male frame is the only frame allowing the external 10 speed gear. The descriptions of these incompatibilities between the alternatives are called the product requirements. The product requirements are often expressed as rules defining compatibilities between components. A configuration is said to be consistent if all requirements are satisfied. For the bike example, there are 10 different consistent configurations (8 configurations with an internal three speed gear and 2 configurations with an external 10 speed gear) out of the 32 possibilities.

In general, the requirements can be complicated and hard to overview for a human, and it is a complex task to determine a consistent configuration. A computer program can be of great help during the configuration process and generally works by checking a user's selections against the rules. This checking is generally hard to perform: either the checking may take unreasonable long time or the results of the checks may be imprecise. There are at least two different ways of treating the rules.

Explicit Enumeration This method typically uses bit-vectors to represent all possible consistent configurations. All possible configurations are tested against the rules and the configurations that turns out to be consistent are enumerated in a list, typically using a hash-table of bit-vectors. One key limit with this approach is that the number of configurations grow rapidly when the number of available components rises (typically, the number of configurations grows exponentially with the number of components). This means that the amount of memory which is required is extremely large and the method is not applicable to large product models. Another problem is that even if the number of configurations is small enough to be kept in memory, the algorithms need to traverse and treat each possible configuration independently yielding running times that are linear in the number of configurations.

Rule/Constraint Propagation When a configuration selection is made, the rule database is searched in order to check for consistency. The search time is unpredictable and therefore often limits are imposed on the allowed time consumption in order to ensure a timely response to the user. In order to meet the time limit, the search must often be ended prematurely without the full and correct result being known. The search is based on the accumulation of information by repeatedly applying the rules from the rule base to the selections that have been made. This is often very costly. Furthermore, the search time, and thus the quality of the search, is highly dependent on exactly how the rules have been formulated.

State-of-the-art tools apply the two techniques described above. They have been developed as sales assistant tools and are now being adapted to the Internet. On the Internet there is no human sales assistant available to compensate for inaccuracies and lack of information. The user is going to execute the whole sales process himself, which imposes hard requirements on the quality of the sales system. The system must have a fast response time and ensure that the results are still accurate. For example, it must never be the case that the user is lead to select an alternative that is inconsistent (i.e., some of the rules become violated) with the user's earlier selections.

State-of-the-art tools have difficulties obtaining precise results and at the same time ensuring desirable response times (while dealing with complex products and allowing the system to handle many concurrent users.)

A number of patents are related to product configuration.

U.S. Pat. No. 6,115,547 discloses a product configuration comprising a specific way of caching earlier configurations improving performance of a configuration program.

U.S. Pat. No. 5,675,784 discloses a product configuration comprising a data structure (a "three tiered hierarchical data structure") to be used for modelling products.

EP 0770239B1 discloses a product configuration comprising an expert system. This configuration method is related to rule/constraint propagation.

U.S. Pat. No. 5,206,949 discloses a product configuration comprising a database search and retrieval system.

U.S. Pat. No. 5,844,554 discloses a product configuration comprising a graphical user interface method for designing the product model.

U.S. Pat. No. 5,987,473 discloses a product configuration comprising a method for performing interactive configuration via a network.

U.S. Pat. No. 5,995,979 discloses a product configuration comprising a method for allowing a user to select an entry in a database over a network.

U.S. Pat. No. 5,996,114 discloses a product configuration comprising a method for handling the many possible configurations. This configuration method is related to Explicit Enumeration.

U.S. Pat. No. 5,745,765 discloses a product configuration comprising a method for allowing a user to select a consistent configuration.

The invention described in this patent applies a known technique symbolic model checking known from formal verification of hardware circuits to solve the computational problems inherent in developing a program for computer assisted configuration. Symbolic Model Checking is described in [K. L. McMillan Symbolic Model Checking: An Approach to the State Explosion Problem].

SUMMARY OF THE INVENTION

Thus, in a first aspect, the invention relates to a method of configuring a product comprising a number of components, the method comprising:
  providing, for each component, information relating to a group of alternatives for the component,
  defining rules relating to compatibilities between alternatives from different components,
  representing the rules in a Directed Acyclic Graph (DAG), and
  iteratively configuring the product by repeatedly:
    choosing a component,
    selecting an alternative from this component's group of alternatives,
    checking the DAG whether the alternative selected is compatible with other chosen alternatives from other components.

In the present context, a component is not to be understood only as the generic description of a physical component. It could also be attributes such as colour and shape, parameters such as number of gears and horsepower. A component could also be understood as "need attributes", which express a need from the user of the configurator rather than a property of the product, such as the type of a bicycle (off-road, city bike, heavy duty bike etc.), the taste of a user (fashionable, classic, childish), or the price or weight or similar properties of interest for a user of a product.

A rule may relate to the compatibility of an alternative from e.g. two different components of the product. However, it may be preferred that the rule relates to compatibility of an alternative from a larger number of components. In an extreme, but in no way unthinkable, is a rule which relates to a product comprising an alternative from each of the components.

Naturally, the information relating to an alternative or a group of alternatives may be information relating to similarities or differences thereof. Normally, this information will be information relevant vis-a-vis the other components and/or the alternatives of the other components.

When having represented the rules in the DAG, it is no longer necessary to check the (normally very large number of) rules. Instead, the DAG may be traversed, analysed or even amended in accordance with information relating to selected/chosen alternatives. This procedure may be made much faster than the individual checking of a number of rules.

In the present context, an alternative is "chosen" if it has been "selected" and found to be part of the combined product which is sought configured—that is, normally, when the selected alternative has been found to be compatible with at least one chosen alternative.

The iterative configuring may be ended when an alternative is chosen for each component and preferably when the chosen alternatives of the components are compatible.

It may be desired to, before the selecting of an alternative, use the DAG to determine, for at least one of the components, a subset of alternatives for the component, so that each of the alternatives in the subset is compatible with the other chosen alternatives from the other components, and providing this information to a user.

In this situation, the user may desire information relating to the compatibility with a number of alternatives for a given component—compatibility with the alternatives already chosen—in order to, normally, select a compatible alternative from that group. This subset may relate to preferences of the user, such as dimensions, colours, manufacturer, place of manufacture, etc.

In may ease the interaction with the system if the information to the user is provided as computer generated speech. This is done by providing a system with a speech synthesizer and the providing of information to a user further comprises
  providing the information by speech generated by the speech synthesizer.

Alternatively, the steps of selecting a component and an alternative may further comprise, for each of the components:
  using the DAG to check which of the alternatives of the component that are compatible with at least one of the chosen alternatives of each of the other components (i.e. those for which alternatives have been chosen),
  providing a user with this information,
  allowing the user to select one of the alternatives that were compatible with at least one of each of the other component's chosen alternatives.

Thus, in this manner, information is provided relating to the compatibility of all alternatives for the component—with the alternatives already chosen, in order for the user to quickly be able to progress in the configuring of the product.

However, it may, instead or in addition, be desired that the steps of selecting an alternative and checking the DAG further comprise the steps of:
  selecting or defining a subgroup of alternatives to the chosen component,
  checking the DAG for which of the alternatives in the subgroup that are compatible with chosen alternatives from other components, and
  providing information relating to which of the alternatives in the subgroup are compatible with chosen alternatives of other components.

One situation where this may be convenient is the situation where the user has not yet decided on a specific alternative, but he provides a subgroup of alternatives that are checked for compatibility with chosen alternatives of other components. This information can be used to further guide the user during configuration.

Another approach that can be beneficial is to:
- at least once, defining information relating to limiting the alternatives of at least one of the components, and
- checking the DAG for which of the alternatives of the components is compatible with the limiting information.

This limiting information may be provided by a user, and information relating to which of the alternatives of the components are compatible with the limiting information may be provided to the user.

Such limiting information may be information relating to compatibilities between alternatives from different groups desired by the user.

The iterative configuring may also be ended upon request from a user, normally at a point therein where there has not been chosen/selected an alternative for each component, or where the alternatives selected/chosen are not fully compatible. Then, information may be provided relating to all possible compatible products comprising at least one chosen alternative for each of the products for which an alternative has been chosen—and this information may be provided to the user.

Thus, the user may end the configuration and then be informed of the total number of compatible products available comprising the alternatives chosen.

Also, the iterative configuring may comprise the step of obtaining the number of all possible compatible products comprising at least one chosen alternative for each of the products for which an alternative is chosen and providing this information to the user. In this manner, the user may be constantly informed of the number of products available comprising the alternatives chosen. It should be noted that the user will be able to actually select or choose more than one alternative for a given component. In this situation, the compatibility check will be that of each such alternative and the total number of potential final products will relate to the sum of potential final products comprising one of those alternatives.

In general, the step of representing the rules in a DAG may comprise representing the rules in a graph comprising:
- at least one terminal node,
- a plurality of nodes comprising:
  - a mathematical expression having a plurality of possible disjoint outcomes and
  - a number of pointers corresponding to the number of possible outcomes of the expression, wherein:
- a pointer of at least one of the nodes points to another of the nodes, and
- a pointer of at least one of the nodes points to one of the at least one terminal node,
- at least one of the nodes being a top-most node from which one or more paths are defined from a top-most node to one of the at least one terminal node via one or more of the nodes and the pointers thereof, each node being part of at least one path.

This is a standard manner of representing rules in a DAG. Thus, the rules are represented as mathematical formula and are introduced into one or more nodes. Each rule comprises one or more outcomes—and the pointers of the nodes each relates to such an outcome. Thus, different outcomes of the rules will provide the traversing of different paths through the graph/DAG.

Thus, the step of representing the rules in the DAG may comprise providing one or more of the nodes with mathematical expressions each comprising a mathematical operator, each operator describing how the rules represented by the nodes pointed to by the pointers of the pertaining node are to be combined in order to represent the combined set of rules.

The step of representing the rules in the DAG may comprise representing the rules in a graph comprising a number of the nodes, the mathematical expression of which is a Boolean expression and/or a variable.

Also, the step of representing the rules in the DAG may comprise representing the rules in a graph comprising nodes, the mathematical expressions of which are ordered according to a given ordering such that, for each node, the expression of an actual node is of a lower order than the expressions of any nodes pointed to by the pointers of the actual node.

Providing an ordering facilitates a number of operations on the DAG, such as searching in a DAG and combining two DAGs.

In order to maintain a suitable DAG, the representing of the rules in the DAG may further comprise the steps of:
- identifying a first and a second node having the same expression and the pointers of which point to the same nodes, and
- having pointers pointing to the first node point to the second node.

In that situation, two nodes actually representing the same contents are reduced to only one.

A preferred manner of providing the DAG is one wherein the step of representing the rules the DAG comprises:
- representing each rule as a logical expression,
- from each logical formula constructing a partial DAG representing the set of possible solutions to the formula,
- constructing the DAG representing all the rules from the partial DAGs representing each of the logical formulas.

This method is rather simple in that the constructing of a partial DAG from a rule is normally a simple task—and the combination of DAGs is a well-known technique, which is, actually, facilitated if the above ordering of the expressions is used.

Preferably, the step of providing the information relating to the alternatives for each component comprises:
- selecting Boolean variables for representing the individual alternatives of the component,
- providing an encoding for each of the alternatives of the component as a combination of Boolean values for the Boolean variables.

Then the step of representing each rule as a logical formula/expression may comprise providing the Boolean variables relating to the alternatives to which the rule relates and interrelating the variables in accordance with the rule.

In general, the step of representing the rules in the DAG preferably comprises providing at least one type of terminal node and wherein, for each path comprising a such terminal node, the combination of all expressions and all pertaining outcomes relating to the pointers of the path relate to either compatible products or non-compatible products.

It is clear from the above that the variables of the mathematical expressions of the nodes of a path relate to a number of alternatives of components. It is also clear that the path is also defined by the pointers linking the nodes together and that those pointers each relate to an outcome of a mathematical expression—and thereby to a given relation between variables. Thus, the information of a path—including the information of the terminal node—preferably provides information as to a product, the alternatives thereof and the compatibility therebetween.

Preferably, the step of representing the rules in the DAG comprises providing a first and a second type of terminal nodes and wherein:

for each path comprising a terminal node of the first type, the combination of all expressions and all pertaining outcomes relating to the pointers of the path relate to a compatible product, and for each path comprising a terminal node of the second type, the combination of all expressions and all pertaining outcomes relating to the pointers of the path relate to a non-compatible product.

In this situation, the first type of terminal node may be adapted to represent "true", "one" or "1", and the second type of terminal node may be adapted to represent "false", "zero" or "0".

In general, the step of selecting an alternative may comprise identifying Boolean variables relating to any other alternative(s) of the component and nodes comprising expressions relating to such other alternative(s) and, in the DAG, identifying paths comprising such nodes and altering any terminal node(s) thereof of the first type to terminal node(s) of the second type. Thus, such paths then may relate directly to "incompatible products" in that these products are no longer interesting—the selected alternative normally not being compatible with the other alternatives for the same component. If the user selects a subgroup of alternatives for that component, the same procedure is, naturally, followed as to those alternatives of the component which are not in the subgroup.

In this situation, the computing of the number of possibilities of different choices may be performed by the following steps applied to the DAG and for each top-most node:

starting from the topmost node and iteratively finding the number of possibilities represented by the actual node, by performing the steps of:

if the node is a terminal node, providing a "1" if the terminal node is of the first type and a "0" if it is of the second type, else: finding the number of possibilities represented by each node pointed to by a pointer of the actual node, and therefrom computing the number of possibilities represented by the node.

Normally, the number of possibilities represented by a node having, for example, a first number of possibilities represented by one pointer and a second number of possibilities by another pointer can be computed as the sum of the first number of possibilites and the second number of possibilites. However, if, due to a size reduction of the DAG (such as "local reduction"), implicit nodes are placed (implicitly) between the actual node and the node(s) pointed to by the first and/or second node(s) these implicite nodes must be taken into account when finding the number of possibilites represented by the actual node.

If, during configuration, a selected alternative is not compatible with other, chosen alternatives, the step of checking the DAG may further comprise, providing information relating to other chosen alternatives which are not compatible with the selected alternative, and providing this information to a user.

In this situation, the user may choose to actually enter or choose/select the selected alternative and then un-choose the or those alternative(s) which is/are not compatible therewith.

A number of manners exist for actually providing the rules relating to the compatibilities. A preferred manner is one where at least one of the rules is defined by obtaining, by querying a database, information relating to alternatives relating of one or more components and/or information relating to compatibility between two or more alternatives to different components, and building one or more rules from the information obtained from the database.

A simple manner of performing this is one wherein the database comprises a two-dimensional table having, in each of a plurality of rows thereof, information relating to a product comprising an alternative from each component, the alternatives being compatible, wherein the step of providing a rule comprises providing a rule relating to the information of each row and wherein the step of representing the rules in the DAG comprises providing a disjunction of the rules.

Thus, each row of the table comprises information relating to a full product comprising an alternative for each component and where all alternatives of each product are fully inter-compatible. The information of a single row may easily be provided as a single rule which is subsequently introduced in the DAG.

This has the advantage seen from the side of the entity providing the product configured that, as the rules relate only to a predetermined range of identified products, only those products may be configured. Thus, even though it seems, from the side of a user performing the configuration, that the configuration is not limited by anything but the compatibilities, the configuration will always end in a product which is identified by the supplyer.

Preferably, the step of checking the DAG whether a selected alternative is compatible with the chosen alternatives comprises searching the DAG for a path from a topmost node to a terminal node, the search comprising:

starting with the top-most node as an actual node, iteratively, until the actual node is a terminal node:

evaluating the mathematical expression in the actual node and determining the outcome thereof in view of the alternatives chosen from other components, selecting the pointer of the node representing the outcome, selecting, as the actual node, the node pointed to by the selected pointer.

providing information relating to the chosen alternatives, and the information relating to the path represents that the choices are compatible.

One simple manner of providing information from a path in the DAG is one providing, from the expressions of the nodes of the path, information relating to which alternative(s) of a given component has/have been chosen, and the information of compatibility of the product comprising those alternatives is given by the representation of the terminal node of the path.

Thus, the information relating to the individual alternatives is derived from the expressions of the nodes and the pointers interconnecting the nodes—and the compatibility information is seen in the terminal node of the path.

Thus preferably, the expressions related to nodes of the DAG are Boolean variables, the terminal nodes represent either "true" or "false", a path comprises one or more nodes each comprising a mathematical expression and a pointer to another node or the terminal node in the path, the information of the path relating to the identities of the variables in the mathematical expression(s) of the node(s) of the path and values or dependencies thereof, the identities and values/dependencies relating to chosen alternatives of components, the chosen components being compatible if the terminal node of the path represents "true" and the chosen components being incompatible if the terminal node of the path represents "false".

A special situation exists where a component may be of a type which, naturally, has to be taken into account during the configuration but which may not be informative or relevant to e.g. a user performing the configuration. Thus, it may be desired to "hide" such components during the configuration.

An example of a component which may be hided is the width of the hub of a bicycle wheel. This width is very important in that it describes the compatibility of a frame and a wheel, but a user configuring a bicycle does not need to pay interest to this point. The system may simply hide this component and make sure that the user is not able to perform selections which are contrary to an implicitly selected hub width (such as defined by an already chosen frame or wheel).

In that situation, the step of representing the rules in the DAG may comprise:
representing the rules in an actual DAG,
selecting at least one of the components to be hidden,
changing the actual DAG by:
identifying nodes in the actual DAG comprising expressions relating to the selected component(s),
removing these nodes from the actual DAG,
adding nodes, not comprising expressions relating to the selected component(s), to the actual DAG so that the compatibilities implied by these component(s) are reflected by the actual DAG,
providing the actual DAG as the DAG representing the rules.

Thus, the DAG is simply altered in a manner so that an alternative of a hidden component which implicitely selects alternatives for other component will implicitely select these alternatives for the other components in a way so that subsequent compatibility checks will relate also to the "hidden" component even though the user will not be able to verify this.

It is preferred to modify the DAG by as early as possible removing the "hidden" components. This may be done by:
for each of the rules, constructing a partial DAG representing the rule,
identifying at least one of the components to be hidden,
selecting an ordering of the identified components,
initially constructing an actual DAG representing no rules and then repeatedly,
selecting a non-selected component of lowest order,
repeatedly, until all partial DAGs comprising expressions relating to the selected component have been chosen:
choosing a partial DAG comprising expressions relating to the selected component,
combining the actual DAG with the chosen partial DAG into a new actual DAG,
changing the actual DAG by:
identifying nodes in the actual DAG comprising expressions relating to the identified component,
removing these nodes from the actual DAG,
adding nodes, not comprising expressions relating to the identified component, to the actual DAG so that the compatibilities implied by the identified component are reflected by the actual DAG,
providing the DAG by combining the actual DAG with all non-chosen partial DAGs.

In general, the method may further comprise:
identifying a user,
performing the step of selecting an alternative of a component by the user through communication between a device controlled by the user and another device where the iterative configuration is performed,
transmitting information relating to the checking of the DAG to the user.

Thus, the main part of the computational load—that is the deriving of the rules and of the DAG as well as the iterative checking of the DAG—is performed remotely from the user and only the results are transmitted to the user. This saves bandwidth on e.g. the Internet where such configuration may be performed on virtually any type of product.

Also, the method may further comprise:
identifying a user,
prior to the iterative configuring:
transmitting the DAG to a device controlled by the user,
performing the iterative configuring on the user's device.

In this manner, the DAG is transmitted to the user which then performs the configuration on the DAG on the client—that is on a computer controlled or maybe even owned by the user.

An especially prefered embodiment is one comprising the step of, during the iterative configuration,:
obtaining information relating to one or more alternatives for components for which no alternatives have been chosen, each of the one or more alternatives being compatible with the chosen alternatives, and
providing the user with this information.

Thus, as only reasonable alternatives are displayed, whereby the configuring may be performed much faster and without the user making mistakes by attempting to combine incompatible alternatives.

A beneficial way for a user to interact with the product configuration is when the method further comprises providing a system with a speech recognizer; and wherein the step of iteratively configuring the product further comprises
choosing a component from a text recognized by the speech recognizer; and
selecting an alternative from this component's group of alternatives from a text recognized by the speech recognizer.

In this manner, alternatives are selected by speech, which in applications such as product configuration over a telephone is highly preferred.

In applications where the product to be configured is a device, it is beneficial if the method further comprises identifying a configurable device and an interface device, and
storing the DAG representing the rules on the configurable device,
uploading the DAG from the configurable device to the interface device, and
in the step of iteratively configuring the product, performing the checking of the DAG whether the alternative selected is compatible with other chosen alternatives from other components on the interface device.

In this manner, all information relating to the configuration of the configurable device, can be stored within the device and accessed from any interface device without the interface device having specific knowledge about the configurable device.

In situations where some of the alternatives can be determined by the configurable device itself, it is beneficial if the method further comprises identifying a list of predetermined components in the configurable device and identifying a list of predetermined alternatives for these components in the configurable device, and wherein the step of iteratively configuring the product further comprises a performing the checking of the DAG whether the alternative selected is compatible with other chosen alternatives from other components and compatible with the predetermined alternatives on the interface device.

The predetermined alternatives makes it easier for the user, since fewer choices of alternatives have to be made.

In the product configuration of many products, it is beneficial to observe that some of the components are observer components for which the user will not choose an alternative but only be interested in what the compatible values are. This can be exploited if the method further comprises identifying a list of observer components and a list of non-observer components, and representing the rules for the non-observer components in a DAG, determining, for each observer component, a subset of the rules, such that from these rules it is possible to determine the alternatives for the observer component that are compatible with alternatives for the non-observer components, representing for each observer component the subset of rules as an observer DAG, and in the step of iteratively configuring the product checking the DAG whether the alternative selected is compatible with other chosen alternatives from other components, determining a set of system determined alternatives by determining for each component whether there is only a single alternative compatible with all the chosen alternatives, for at least one of the observer components, checking the observer DAG for the observer component to determine whether there is only a single alternative compatible with other chosen alternatives and the set of system determined alternatives, and providing this information to a user.

Representing the rules in different DAGs is advantageous, because it decreases the total size of the DAGs providing the benefits of requiring less storage and increasing performance.

Further useful information can be given to the user if the step of iteratively configuring the product further comprises for each pair of component and alternative providing a classification of the state of the pair, adopting the classification to one of a list of outcomes comprising blocked, selectable, user selected, system selected, or forceable, providing a classification of blocked when the alternative cannot be chosen for the component even without considering choices of alternatives for other components, providing a classification of selectable when the alternative for the component is compatible with the chosen alternatives from the other components, providing a classification of user selected when the alternative has already been chosen for the component, providing a classification of system selected when the alternative is the only choice for the component that is compatible with the chosen alternatives from the other components, providing a classification of forceable when the alternative can be chosen for the component but is incompatible with some of the other choices of alternatives of the other components, and providing information on the classification to a user.

The classification can be used in the user interface by providing useful information to the user about the effect of possible choices of alternatives. Some are impossible, some are directly selectable, others have already been selected by the user or the system, and finally some are forceable, meaning that they can be chosen if the user is prepared to undo some previous choices.

A second aspect of the invention relates to a computer program comprising computer program code means adapted to perform all the steps of the above method when said program is run on a computer.

The invention also relates to that computer program embodied on a computer-readable medium and a computer readable medium comprising the computer program.

BRIEF DESCRIPTION OF THE DRAWINGS

In the following, a preferred embodiment of the invention will be described in relation to annexes and the figures in which.

Figure 1:
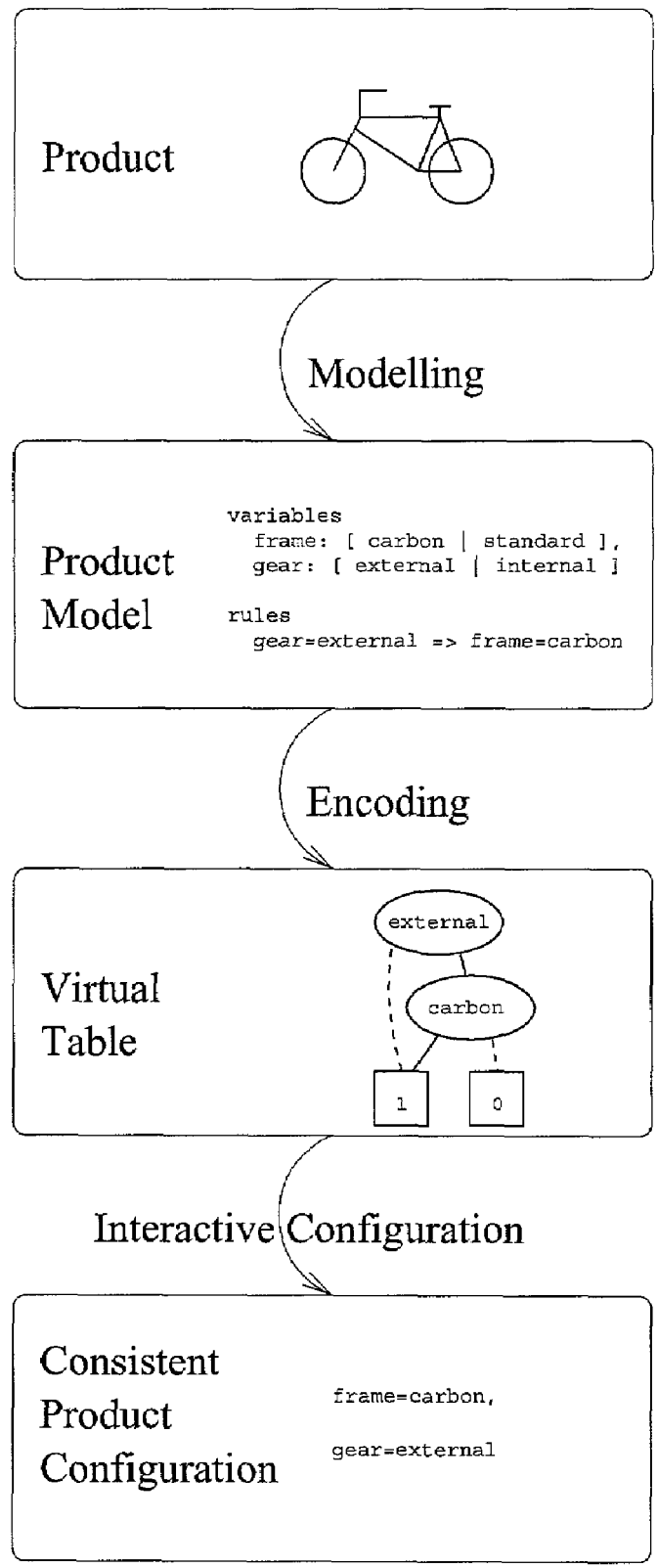
FIG. 1 shows an overview of the Configuration Process

In Annex A the preferred embodiment for the "product description" (an XML document type declaration) is given.

In Annex B, preferred embodiments are given for a number of algorithms:

Algorithm 1: Basic BDD operations.

Algorithm 2: MULTIAPPLY. Apply an operator to a set of vertices.

Algorithm 3: MULTIEXISTS. Existentially quantification of a a set of variables.

Algorithm 4: ORDERRULES. Order the rules according to the private variables.

Algorithm 5: CONJOINEXISTS. Conjoin BDDs and existentially quantify variables.

Algorithm 6: VIRTUALIZETABLE. Build a BDD representing a table.

Algorithm 7: CONFIG1. Restricting a virtual table with respect to a selection.

Algorithm 8: CONFIGCONSISTENT. Restricting a virtual table with respect to a list of selections.

Algorithm 9: CONFIGCHECK. Restricting a virtual table with respect to a list of selections, ensuring non-emptiness.

Algorithm 10: CONFIGIT. Restricting a virtual table with respect to a list of compatible selections, selecting compatible values for the remaining product variables Algorithm 11: CONFIGCOUNT. Counting the number of consistent configurations in a virtual table.

Algorithm 12: DETERMINEDOMAIN. Determine the possible values for a flattened variable in a virtual table.

Algorithm 13: CONFIGCLIENT. Interactive Configuration, Client.

Algorithm 14: CONFIGSERVER. Interactive Configuration, Server.

DETAILED DESCRIPTION OF THE DRAWING

The invention will be described in terms of a preferred implementation as applied to interactive computer-assisted configuration of complex products composed of several parts, this being the origin of the problem addressed by the invention. However, it will be understood by those skilled in the art that the invention is not limited to this specific application but has a broader scope of application both with respect to the method of performing the configuration as well with respect to the structure of the product to be configured.

The present invention comprises a method for configuring a product. Without limiting the invention a product model is used to model relevant aspects of the product. In the product model the product is composed of a number of components, and for each of these components there is a group of alternatives. Each component typically has attributes describing relevant aspects of the component such as colour, behaviour, weight, interfaces, etc. For each of these attributes there is a group of concrete values. For example, the colour attribute may have the values red, blue or green. Furthermore, there are rules relating to compatibilities between alternatives for different components.

The method for configuring the product comprises:

Specifying relevant aspects of the product as the product model. The product model describes components, attributes for these components, as well as alternatives for each component and values for each attribute. Furthermore the product model comprises a group of rules relating to compatibilities between components and attributes.

Encoding this product model as a virtual table representing the consistent configurations of the product model.

Configuring the product yielding a consist configuration using the virtual table. Typically this is done in an interactive session between a user and a configuration program.

FIG. 1 sketches these steps. The figure shows a specific product (a bike), a specific form for the product model (a textual description), a specific virtual table (a Boolean Decision Diagram), and a specific interactive configuration process. It is clear to the person skilled in the art that the invention is not limited to these specific choices.

First a product model of the concrete product, here a bike, is made. This concrete product model captures that two different frames exist and two different gears exist. Furthermore, the product model captures, by a rule, that if the external gear is chosen, the frame must be a carbon frame.

The product model is encoded as a virtual table. The virtual table is a directed acyclic graph that represents all consistent configurations. This concrete directed acyclic graph is a Boolean Decision Diagram (BDD) (known to the man skilled in the field of symbolic model checking) with two variables external (representing that the selected gear is external) and carbon (representing that the carbon frame is selected). Informally, the connection between the BDD and the product model is: If and only if an assignment of Boolean values to external and carbon leads to the terminal 1 the corresponding configuration is consistent.

A computer assisted configuration of the bike is now performed. The computer program shows possible alternatives for each component. The user of the computer program selects a component and selects one of the possible alternatives for this component. For example, the user can choose the gear component, and that the gear should be external. Based on the user's selection the computer program uses the virtual table for finding out which subsequent selections that will lead to consistent configurations. For example the computer program will use the virtual table to determine that a selection of an external gear implies that the frame must be a carbon frame. This interactive process continues until an alternative has been selected for each component. The result of this configuration process is a consistent product configuration.

In the following three sections the product model, the encoding process and the final configuration process are further described. In each section, the preferred embodiment is given.

The Product Model

Generally, the product model is used to describe what components the product is composed of and the inter-dependencies between these components.

The nature of the invention puts no specific limitation on the product model. Without limiting the invention, however, the product model will often define a set of product variables, the domain of each of these variables and a set of rules. Each product variable represents a component or an attribute. For a product variable representing a component the domain of the product variable corresponds to the possible alternatives for the component. For a product variable representing an attribute, the domain of the product variable corresponds to the possible values for the attribute. The possible domains of the product variables include the discrete as well as the continuous domains. The inter-dependencies between components and attributes are expressed as rules and typically formulated as formulas over the product variables.

An example of a product model is a product model of a computer, composed of a motherboard (three different alternatives), a CPU (two alternatives), and a harddisk (two alternatives). Since a CPU is connected to a motherboard using a slot, the slot type is an important attribute of both the CPU and the motherboard and since a harddisk is connected to a motherboard using a specific controller type, the controller type is also an important attribute. The following is a textual example of a computer product model:

```
types
    cpu-slot-t = [ SLOT-1 | SLOT-A ],
    controller-t = [ IDE | SCSI ]
variables
    public motherboard: {
        public name:
            [ Abit-BX6-ATX | Aopen-AX6BP-ATX
            | Aopen-AK-72-KX133-ATX ],
        private slot: cpu-slot-t,
        private controller: controller-t
    }
    public harddisk: {
        public name:
            [ IBM-DeskStar-25GP-10,1GB
            | Seagate-Barracuda-9-9,1GB ],
        private controller: controller-t
    }
    public cpu: {
        public name: [ Intel-Celeron-A-366MHz
            | Athlon-AMD-500 ],
        private slot: cpu-slot-t
    }
rules
    motherboard.slot=cpu.slot,
    motherboard.controller=harddisk.controller,
    motherboard.name=Abit-BX6-ATX =>
      motherboard.slot=SLOT-1 ∧ motherboard.controller=IDE,
    motherboard.name=Aopen-AX6BP-ATX =>
      motherboard.slot=SLOT-1 ∧ motherboard.controller=SCSI,
    motherboard.name=Aopen-AK-72-KX133-ATX =>
      motherboard.slot=SLOT-A ∧ motherboard.controller=IDE,
    harddisk.name=IBM-DeskStar-25GP-10,1GB =>
```

-continued

```
harddisk.controller=IDE,
harddisk.name=Seagate-Barracuda-9-9,1GB =>
harddisk.controller=SCSI,
cpu.name=Intel-Celeron-A-366MHz => cpu.slot=SLOT-1,
cpu.name=AMD-Athlon-500 => cpu.slot=SLOT-A
```

The first section declares types that will be used to define the types of product variables. The next section declares product variables. These variables each have an identifier and a type. The type system for this example comprises atomic constructs as well as record construction ({ . . . }) and enumerated types ( . . . | . . . | . . . ). For example, the cpu is a product variable comprising a record consisting of a name and a slot, and this slot is of type cpu-slot-t. cpu-slot-t is declared as an enumerated type comprising the following two alternatives: SLOT-1 and SLOT-A. The private and public modifiers are used to control what components or attributes that are presented to an end-user during configuration (further details are given below). The third section declares the rules. These rules are general Boolean formulas over the product variables, and all rules must be satisfied for a consistent configuration. Generally, the rules can express any relationship between product variables, but the concrete rules presented in this example can be thought of as divided into two different categories:

Attribute rules specifying the value of a certain attribute for a specific alternative. For example we specify the slot type of the Aopen-AX6BP-ATX motherboard to be SLOT-1.

Compatibility rules specifying general inter-dependencies between alternatives/attributes from different components. For example we specify that the controller type of the harddisk must be equivalent to the controller type of the motherboard.

In this setup a configuration comprises the selection of a concrete value for all public parts of product variables. In the computer example, this comprises the selection of a motherboard name, a CPU name, and a harddisk name. A consistent configuration of the computer is a configuration satisfying the rules of the computer product model. An example of a consistent configuration is the selection of motherboard.name to Abit-BX6-ATX, cpu.name to Intel-Celeron-A-366 MHz and harddisk.name to IBM-Deskstar-25GP-10, 1 GB.

In the example above the product model is represented textually. However, the invention is not restricted to such a representation. Instead, the complete representation of the product model can be divided between multiple representations. An aspect of the invention combines product descriptions with product tables to obtain the complete product model. The product description is generally used to capture the structure of the product by defining the components and their attributes, and the product tables are generally used to capture the concrete alternatives for the components as well as the concrete values for the attributes.

This approach allows huge tables of product data that normally would be hard to comprehend to be turned into a product model for computer assisted configuration. The applications includes the construction of a real estate sales shop where it appears to the potential buyer of a house that he "configures" his own house. In reality he chooses among for example 10.000 houses using simple drop-down menus presenting all consistent choices. In this example attributes include price range, location, garage, swimming pool, number of rooms, area, etc.

The example computer product model can be divided into a product description and three product tables. The product description consists of the same sections as the original computer product model, but the attribute rules have been removed:

```
types
    cpu-slot-t = [ SLOT-1 | SLOT-A ],
    controller-t = [ IDE | SCSI ]
variables
    public motherboard: {
        public name:  [ Abit-BX6-ATX | Aopen-AX6BP-ATX
                        | Aopen-AK-72-KX133-ATX ],
        private slot: cpu-slot-t,
        private controller: controller-t
    }
    public harddisk: {
        public name:  [ IBM-DeskStar-25GP-10,1GB
                        | Seagate-Barracuda-9-9,1GB ],
        private controller: controller-t
    }
    public cpu: {
        public name:  [ Intel-Celeron-A-366MHz | Athlon-AMD-500 ],
        private slot: cpu-slot-t
    }
rules
    motherboard.slot=cpu.slot,
    motherboard.controller=harddisk.controller
```

The first table defines attributes for the motherboard component:

| motherboard.name | motherboard.slot | motherboard.controller |
|---|---|---|
| Abit-BX6-ATX | SLOT-1 | IDE |
| open-AX6BP-ATX | SLOT-1 | SCSI |
| Aopen-AK-72-KX133-ATX | SLOT-A | IDE |

The second table defines attributes for the harddisk component:

| harddisk.name | harddisk.controller |
|---|---|
| IBM-DeskStar-25GP-10,1GB | IDE |
| Seagate-Barracuda-9-9,1GB | SCSI |

The third and last table defines attributes for the cpu component:

| cpu.name | cpu.slot |
|---|---|
| Intel-Celeron-A-366MHz | SLOT-1 |
| Athlon-AMD-500 | SLOT-A |

A textual product model can be obtained from a product description and a set of product tables by the following method:

a For each table, translating the table to a rule.

Adding the rules obtained in the previous step to the product description.

The table is translated to a rule using the key observation that a table can be viewed as an expression on disjunctive normal form. A table with n rows and m columns is translated as follows:

A cell in row i and column j with content $x_j^i$ in a column labelled $y_j$ is translated to an atomic rule $y_j = x_j^i$.

For a row i among the n rows, all atomic rules obtained from cells on this row are combined by conjoining the atomic rules together to form a sub-rule $(y_1 = x_1^i \wedge \ldots \wedge y_m = x_m^i)$.

All n sub-rules are combined by disjoining the sub-rules together to one big rule:

$$(y_1 = x_1^1 \wedge \ldots \wedge y_m = x_m^1) \vee \ldots \vee (y_1 = x_1^n \wedge \ldots \wedge y_m = x_m^n).$$

This one big rule is the table translated to a rule.

For example, the last table of the computer product model is translated to:

rules
(cpu.name=Intel-Celeron-A-366 MHz/\cpu.slot=SLOT-1)/\/ (cpu.name=Athlon-AMD-500/\cpu.slot=SLOT-A)

A convenient extension is to add tablefilters mapping values in the product table to values in the product description. An example of such a filter maps specific prices in the product table (such as $100, $223, $817) to price levels in the product description (such as cheap, reasonable and expensive). Such a mapping will typically map all prices in a given interval to the same price level.

The translation to a rule does not need to be performed explicitly. An aspect of the invention is that the translation instead can be done on the fly during the construction of the virtual table.

Preferred Embodiment of the Product Model

The preferred embodiment of the product model is composed of a product description and a set of product tables. The product description is given as an XML 1.0 document. The product tables are combinations of ODBC data sources and SQL queries.

The XML document is defined using the document type declaration (DTD) shown in Annex A 10. Basically, a product description contains:

Constant declarations A constant can be specified explicitly (constant), or as an SQL query that when evaluated should return exactly one cell dbconstant.

Type declarations A type declaration (type) basically declares a type identifier as a shorthand for a specific type (see below).

Product Variables A product variable (productvariable) can be declared public or private and is of a given a type (see below).

Rules A rule is a Boolean expression over the product variables that should be satisfied for the configuration to be consistent. The expression can either be specified explicitly (rule) or by the use of an SQL query that when evaluated should return a table that can be translated to a rule (dbrule).

Database details Finally, a couple of extra parts of information can be supplied: Alias definitions(alias) defines an ODBC data source, SQL query definitions (sqlqueries) and finally, filters (filter) that can be used to map between values in the databases and values in the product description.

The rules comprise structured expression: atomic expressions such as Booleans (true, false), values from bounded sub-ranges (0, 1, . . . , n) as well as compound expressions built from arrays, record expressions and enumeration (sum) expressions. Furthermore, arithmetic and Boolean operators are provided. In the preferred embodiment the allowed arithmetic operations include addition, subtraction and multiplication and the multiplication operation is only allowed when at least one of the operands is a constant. At first the allowed types of arithmetic operators seem odd, but as we shall see later this choice works very well together with the preferred embodiment for the virtual table.

The choice of XML as language for the product description allows for a direct translation to both a textual format, as well as a tree data structure for representation on a computer.

Figure 2:
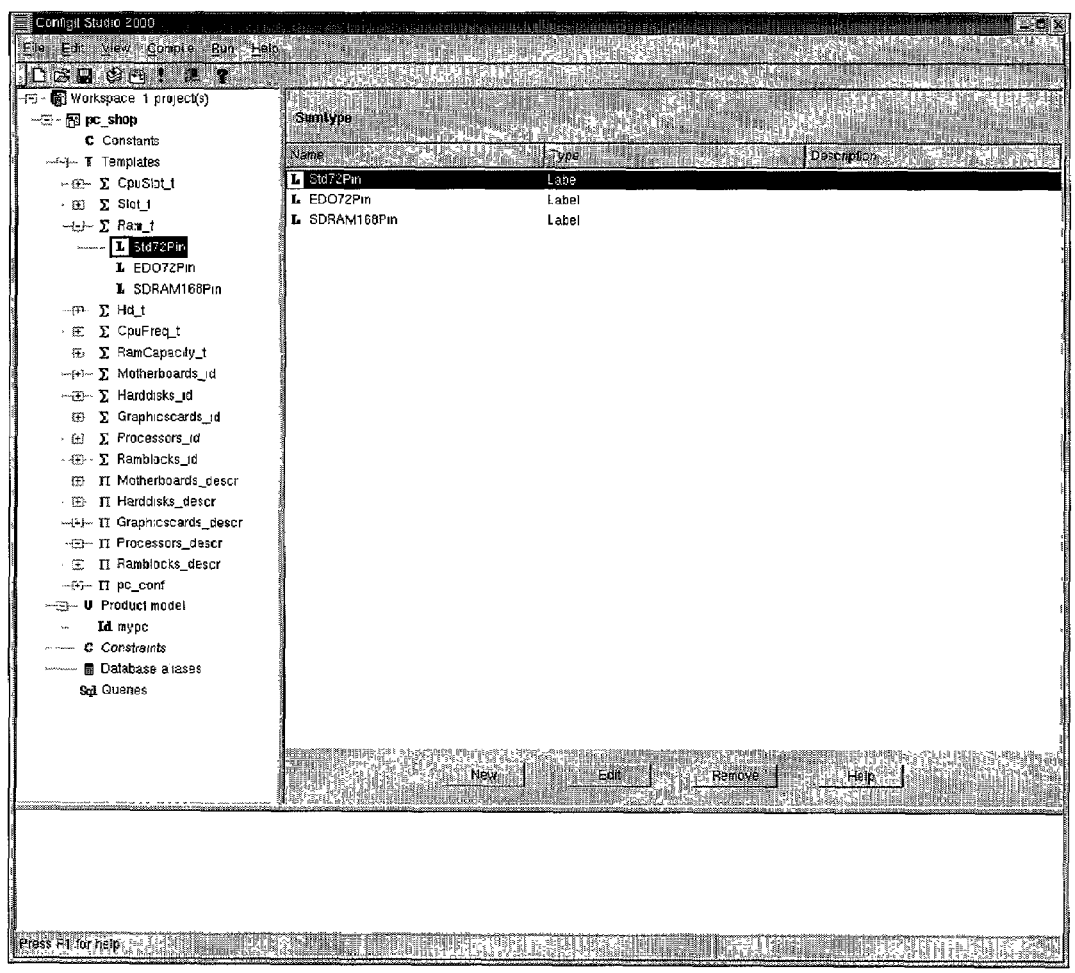
FIG. 2 shows the creation of the Product Model using ConfigIt Studio.

The preferred method for developing the product description is by the use of a graphical user interface. ConfigItStudio is such a graphical user interface, see screen-shot in FIG. 2. The screen-shot shows the ConfigItStudio product model editor, while editing a pc product model. The tree view in the left area of the screen-shot is a tree view of the product description and is closely related to the XML document type declaration. (On the screen-shot, the term "template" is used for a type declaration and the term "constraint" is used for a rule.) The area to the right shows details for the selected vertex in the tree and can be used for manipulating the vertex. The menu on the top of the screen-shot can be used to build (the "Compile" menu) a virtual table for the product model (see below) and run a virtual table server (the "Run" menu) for interactive configuration over the Internet (see below).

Encoding the Product Model as a Virtual Table

An important aspect of the invention is the process of transforming a product model to a compact and efficient representation. This process we refer to as virtual tabulation and the resulting representation we call a virtual table. There are many ways in which this transformation can be done. The purpose of the transformation is to first find a way of encoding and finding all solutions to the configuration problem and then tabulate them virtually in a virtual table such that information relating to the configuration problem can be obtained by efficient queries to the virtual table. The encoding involves finding an encoding of the components of the product model and a corresponding encoding of the rules. A DAG will represent all the rules, such that enquiries about valid solutions to the rules can be performed efficiently. The virtual table consists of this DAG and information relating to the relationship between product model and DAG.

The benefits of the present invention over state-of-the-art comes from the step of using a DAG to represent all rules in such a manner that enquiries can efficiently be made as if a table of all solutions were in fact present. A full table would most often be too big to be practical, whereas proper chosen encodings can result in small DAGs while maintaining the precision by having tabulated all solutions.

The most vital part of the virtual table is the DAG representing each an every consistent configuration. Since there, for a real-life product model, are incredibly many such configurations the DAG must somehow capture these configurations in an implicit manner. Still, the DAG must represent exactly these configurations (ie., without "loosing precision"). The requirements to the DAG can be divided into two categories:

Functional requirements The DAG must be able to represent a set of configurations, each of those configuration defining a value for each of the product variables. Basic algorithms on the DAG must mimic operations and functions on such configuration-sets:

Building the set union and building the set intersection of a group of configuration-sets, building the set difference of two configuration-sets, and, changing, restricting or extending the possible values of a variable in a configuration-set, etc.

Checking for set emptiness, set inclusion and set equivalence. Determining possible values of a variable and determining the number of configurations in a configuration set.

Efficiency requirements The nature/structure of the rules in the product model implies that many of the algorithms introduced above will have a typical worst case running time that is (at least) exponential in the number of product variables. The size of the DAG will also typically worst case be (at least) exponential in the number of product variables. Nevertheless, it must be the case that for real-life product models the algorithms should run efficiently and the DAG representations should be compact.

These requirements can at first seem hard to fulfill, but it turns out that for real-life product models such DAGs in fact exists!

A Boolean Decision Diagram (BDD) is a DAG comprising nodes each containing a single Boolean variable. It is well known from the area of formal verification of hardware circuits that BDDs can be used to encode arbitrary Boolean functions of type (where n is the number of Boolean variables):

$$B^n \to B.$$

These functions are isomorphic to configuration-sets for "Boolean product models." (By a "Boolean product model" we think of a product model where the values of the product variables are limited to true and false). Therefore, if it is possible to encode general product models as such Boolean product models, and, furthermore, if the needed configuration algorithms can be be expressed in terms of basic BDD operations, then it is possible to 1) represent the virtual table of general product models using BDDs and 2) use this virtual table for performing actual configuration of general products.

For BDDs it turns out that all these requirements are fulfilled and, furthermore, for most real-life product models the algorithms are efficient and the DAGs are compact. In fact, BDDs are the preferred embodiment of the DAG.

However, the invention is not limited to such DAGs. Many other DAGs have representation and algorithms that can be viewed as sets and operations on sets, respectively. The DAG must be carefully chosen based on the language for expressing the rules in the product model.

For example, Difference Decision Diagrams (See Moller et al: *Difference Decision Diagrams*. In proceedings Annual Conference of the European Association for Computer Science Logic (CSL), Sep. 20-25 1999. Madrid, Spain.) can be used to express (a sub-set of) functions of type $R \to B$, and at the same time provides the needed algorithms. The immediate advantage is that we thereby have a method of encoding product models where the rules comprise (a restricted subset) of quantified expression over variables with continuous domains. On the other hand, the disadvantage is that the algorithms are less efficient (satisfiability of the rules that can be encoded turn out to be pspace-hard).

Another approach, relevant when the rules of the product model comprises more general arithmetic operations is the use of BDDs over interpreted Boolean variables (see W. Chan, R. J. Anderson, P. Beame, and D. Notkin: *Combining constraint solving and symbolic model checking for a class of systems with non-linear constraints*. In O. Grumberg, editor, Computer Aided Verification, 9th International Conference, CAV'97 Proceedings, volume 1254 of Lecture Notes in Computer Science, pages 316-327, Haifa, Israel, June 1997. Springer-Verlag.). Each Boolean variable represents a formula, a path in the DAG represents a conjunction of such formulas and satisfiability of such path a path can be determined using for example linear programming.

The encoding the product model as a virtual table will in the following be described in its preferred embodiment (using BDDs). However, the person skilled in the art can tweak the algorithms to use a different underlying data structured, for example one of the two data structures mentioned above.

Preferred Embodiment for Encoding the Product Model as a Virtual Table

The preferred embodiment for encoding the product model as a virtual table comprises the following steps:

Static expansion The product model is expanded by flattening the type hierarchy. The result is a flattened product model and a symbol table connecting the product model with the flattened product model.

BDD encoding A BDD is built for each rule and one big BDD is built representing all consistent configurations.

In the following we first show how to perform the static expansion. The flattened product model is the result of this static expansion and is created so that it is suitable for encoding using BDDs.

Static Expansion

The static expansion is performed by flattening the type hierarchy. The result is a flattened product model and a symbol table relating the product model and the flattened product model.

The flattened product model is obtained by 1) the removal of record expressions, 2) simplification of the domains and 3) encoding in Boolean form. The removal of record types is done by, for each product variable comprising record types, replacing the product variable with a list of flattened variables. Furthermore, all expressions over this product variable are replaced by expressions over the flattened variables. After this replacement all records have been removed from the product model. For the computer product model, this step results in the following product model. (Recall, that motherboard was a product variable of record type composed of name, slot and controller):

```
types
  cpu-slot-t = [ SLOT-1 | SLOT-A ],
  controller-t = [ IDE | SCSI ]
variables
  public motherboard_name:
      [ Abit-BX6-ATX | Aopen-AX6BP-ATX
       | Aopen-AK-72-KX133-ATX ],
  private motherboard_slot: cpu-slot-t,
  private motherboard_controller: controller-t,
  public harddisk_name:
      [ IBM-DeskStar-25GP-10,1GB | Seagate-Barracuda-9-9,1GB ],
  private harddisk_controller: controller-t
  public cpu_name: [ Intel-Celeron-A-366MHz | Athlon-AMD-500 ],
  private cpu_slot: cpu-slot-t,
rules
  motherboard_slot=cpu_slot,
  motherboard_controller=harddisk_controller,
  motherboard_name=Abit-BX6-ATX =>
    motherboard_slot=SLOT-1 ∧ motherboard_controller=IDE,
  motherboard_name=Aopen-AX6BP-ATX =>
    motherboard_slot=SLOT-1 ∧ motherboard_controller=SCSI,
  motherboard=Aopen-AK-72-KX133-ATX =>
    motherboard_slot=SLOT-A ∧ motherboard_controller=IDE,
  harddisk_name=IBM-DeskStar-25GP-10,1GB =>
  harddisk_controller=IDE,
  harddisk_name=Seagate-Barracuda-9-9,1GB =>
  harddisk_controller=SCSI,
  cpu_name=Intel-Celeron-A-366MHz => cpu_slot=SLOT-1,
  cpu_name=AMD-Athlon-500 => cpu_slot=SLOT-A
```

The second step of the flattening of the product model comprises simplification of the domains of the flattened variables. All flattened values are turned into numbers, and the domain of each flattened variable is turned into an interval. For example, for the cpu slot a value 0 is used instead of SLOT-1 (which was the first alternative for the cpu slot) and a value 1 is used instead of SLOT-A (the second alternative). For the computer product model, the resulting product model is:

```
variables
    public motherboard_name: 0..2,
    public harddisk_name: 0..1,
    public cpu_name: 0..1,
    private motherboard_slot: 0..1,
    private cpu_slot: 0..1,
    private motherboard_controller: 0..1,
    private harddisk_controller: 0..1
rules
    motherboard_slot=cpu_slot,
    motherboard_controller=harddisk_controller,
    motherboard=0 => motherboard_slot=0 /\ motherboard_controller=0,
    motherboard=1 => motherboard_slot=0 /\ motherboard_controller=1,
    motherboard=2 => motherboard_slot=1 /\ motherboard_controller=0,
    harddisk=0 => harddisk_controller=0,
    harddisk=1 => harddisk_controller=1,
    cpu=0 => cpu_slot=0,
    cpu=1 => cpu_slot=1
```

The last step of the flattening of the product model comprises the encoding of the product model in Boolean form. Each flattened variable is replaced by a list of Boolean variables and each rule is replaced by a new rule over these Boolean variables.

A flattened variable with a domain of type 0 . . . n is replaced by $\lceil \log_2(n+1) \rceil$ Boolean variables. A unique assignment to these Boolean variables is chosen for each of the n+1 values. For example, to encode the three-valued domain (n=2) of the motherboard-name flattened variable, two Boolean variables are needed: $X0$ and $X1$. An assignment of the Boolean variables is chosen for each value in the domain: For the value 0: $X0=0$, $X1=0$, for the value 1: $X0=0$, $X1=1$, and, finally, for the value 2: $X0=1$, $X1=0$. Each rule is now replaced by a new rule over the Boolean variables obtaining the flattened product model. For example, the flattened product model for the computer product model is:

```
variables
    public X0, X1, X2, X3
    private X4, X5, X6, X7
rules

X4=X5,
X6=X7,
(X0=0 /\ X1=0) => X4=0 /\ X6=0,
(X0=0 /\ X1=1) => X4=0 /\ X6=1,
(X0=1 /\ X1=0) => X4=1 /\ X6=0,
X2=0 => X7=0,
X2=1 => X7=1,
X3=0 => X5=0,
X3=1 => X5=1
```

During the flattening of the product model a symbol table is built. This symbol table comprises two tables. The first table contains information about type, the domain of each of the flattened variables as well as the Boolean variables used to encode values for this variable. For the computer product model, this table is:

| Flattened variable | Type | Integer domain | Boolean variables |
|---|---|---|---|
| motherboard_name | public | 0..2 | X0, X1 |
| harddisk_name | public | 0..1 | X2 |
| cpu_name | public | 0..1 | X3 |
| motherboard_slot | private | 0..1 | X4 |
| cpu_slot | private | 0..1 | X5 |
| motherboard_controller | private | 0..1 | X6 |
| harddisk_controller | private | 0..1 | X7 |

The second table relates the flattened values, their integer values and the unique Boolean assignments. For the computer product model, this table is:

| Flattened variable | Flattened value | Integer value | Boolean values |
|---|---|---|---|
| motherboard_name | Abit-BX6-ATX | 0 | 0,0 |
| motherboard_name | Aopen-AX6BP-ATX | 1 | 0,1 |
| motherboard_name | Aopen-AK-72-KX133-ATX | 2 | 1,0 |
| harddisk_name | IBM-DeskStar-25GP-10,1GB | 0 | 0 |
| harddisk_name | Seagate-Barracuda-9-9,1GB | 1 | 1 |
| cpu_name | Intel-Celeron-A-366MHz | 0 | 0 |
| cpu_name | Athlon-AMD-500 | 1 | 1 |
| motherboard_slot | SLOT-1 | 0 | 0 |
| motherboard_slot | SLOT-A | 1 | 1 |
| cpu_slot | SLOT-1 | 0 | 0 |
| cpu_slot | SLOT-A | 1 | 1 |
| motherboard_controller | IDE | 0 | 0 |
| motherboard_controller | SCSI | 1 | 1 |
| harddisk_controller | IDE | 0 | 0 |
| harddisk_controller | SCSI | 1 | 1 |

BDD Encoding

The construction of the DAG is now performed. The preferred embodiment is a (Reduced Ordered) Binary Decision Diagram.

The use of Boolean Decision Diagrams for the representation of Boolean formulas is well known. For an introduction to Boolean Decision Diagrams see [Cristoph Meinel & Thorsten Theobald: *Algorithms and Data Structures in VLSI Design*, Springer 1998]. We will use the following (well known) textual representation of BDDs:

0 represents the terminal BDD 0 (true),
1 represents the terminal BDD 1 (false),
(a⊗b) represents the BDD obtained by applying a and b with the any binary Boolean operator denoted by ⊗ operator.
∃x.a represents the BDD obtained by existentially quantifying out the variable x from the BDD a.
(x→a, b) is the BDD representing the formula if x then a else b, which can be expressed in terms of simpler operators as $(x \wedge a) \vee (\neg x \wedge b)$.

Figure 5:
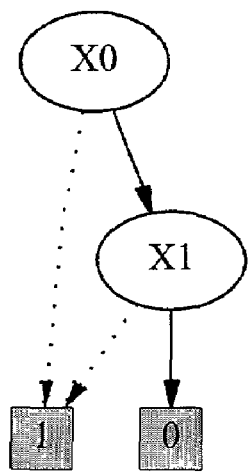
FIG. 5 shows another PC Example, exemplifying a BDD representing the domain constraints.

BDDs has a well known graphical representation. FIG. 5 is an example of this representation. The figure is a BDD over two variables $X_0$ and $X_1$. The chosen ordering ≲ of the variables is $X_0 \lesssim X_1$ and the BDD represents the formula:

$$X_0 \rightarrow ((X_1 \rightarrow 0, 1), 1) = (\neg X_0) \vee (\neg X_1).$$

Basic operations on BDDs for the construction and decomposition of BDDs are sketched in Algorithm 1. The algorithm MK is used for the construction of vertices, the algorithm APPLY for applying an operator on two vertices and the algorithm EXISTS for building a BDD representing the existential quantification of a variable in a BDD. The algorithms VAR, LOW and HIGH are simple functions used for decomposing BDDs: VAR(u) returns the variable associated with the vertex u, LOW(u) returns the low-son associated with the vertex u and HIGH(u) returns the high-son associated with the vertex u. The algorithm FULLONESAT(u) computes a new BDD v fulfilling v→u such that the BDD u has exactly one satisfying assignment (naturally, u must be feasible, i.e., contain at least one solution). The algorithm ANYSAT(u) returns a satisfying assignment of values to the variables in u (again, u must be feasible). Finally, the algorithm SATCOUNT(u) returns the number of assignments satisfying u.

The construction of the BDD representation takes its basis in the flattened product model. First, a suitable ordering of the Boolean variables are chosen. The choice of this ordering is important for the size of the constructed BDDs. In the preferred embodiment, the ordering is chosen by keeping Boolean variables representing the same flattened variable next to each other. A suitable ordering for the computer product model is $X_0 \leq X_1 \leq X_2 \leq X_3 \leq X_4 \leq X_5 \leq X_6 \leq X_7$.

Figure 4:
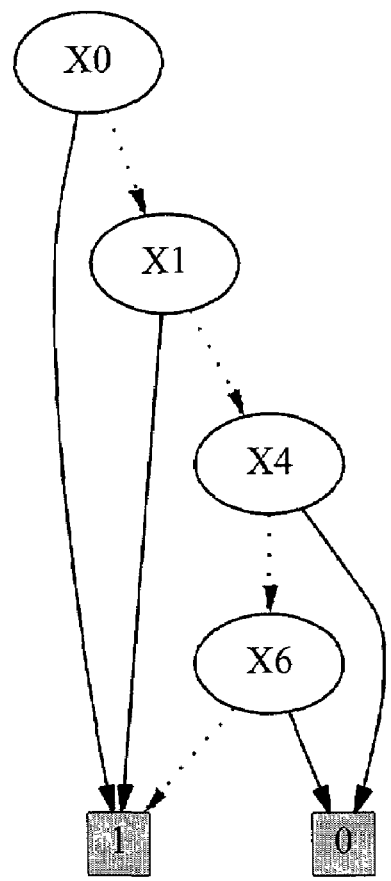
FIG. 4 shows a PC Example, exemplifying a BDD representing the third rule.

Having chosen an ordering, each of the rules is encoded as a BDD. For example, the BDD for the third rule ($X0=0 \land X1=0) \Rightarrow (X4=0 \land X6=0$) is constructed by encoding the expression (shown in FIG. 4):

$$(\neg X_0 \land \neg X_1) \rightarrow (\neg X_4 \land \neg X_6).$$

The encoding is performed using the well known MK and APPLY algorithms. In the following the set R refers to the set of rules, each rule encoded as a BDD.

Thereafter, a domain constraint representing the possible Boolean variable assignments is made for each flattened variable. For example, three possible values exists (0, 1 and 2) for the flattened variable motherboard.name. Therefore two Boolean variables are used to encode the domain using the assignments (X0=0, X1=0), (X0=0, X1=1), and, (X0=1, X1=0), respectively. In FIG. 5 the BDD for the domain constraint for motherboard.name is shown. Observe that the remaining (unused) assignment (X0=1, X1=1) leads to the terminal 0. Since the domain size of all the other flattened variables is 2 (corresponding to a single Boolean variable), it turns out that all other domain constraint BDDs are represented by the terminal BDD 1. The preferred method for building these BDDs is also by the use of the MK and APPLY algorithms. In the following the set D refers to the set of domain constraints, each domain constraint encoded as a BDD.

The BDDs built at this stage will be used as building blocks for the creation of one big BDD representing all rules R and all domain constraints D. This BDD is built by first conjoining the BDDs for the individual rules to one BDD $R_{all}$:

$$R_{all} \stackrel{def}{=} \bigwedge_{r \in R} r.$$

Here $\bigwedge_{r \in R} r$ denotes the result of conjoining together all elements r from R.

Figure 6:
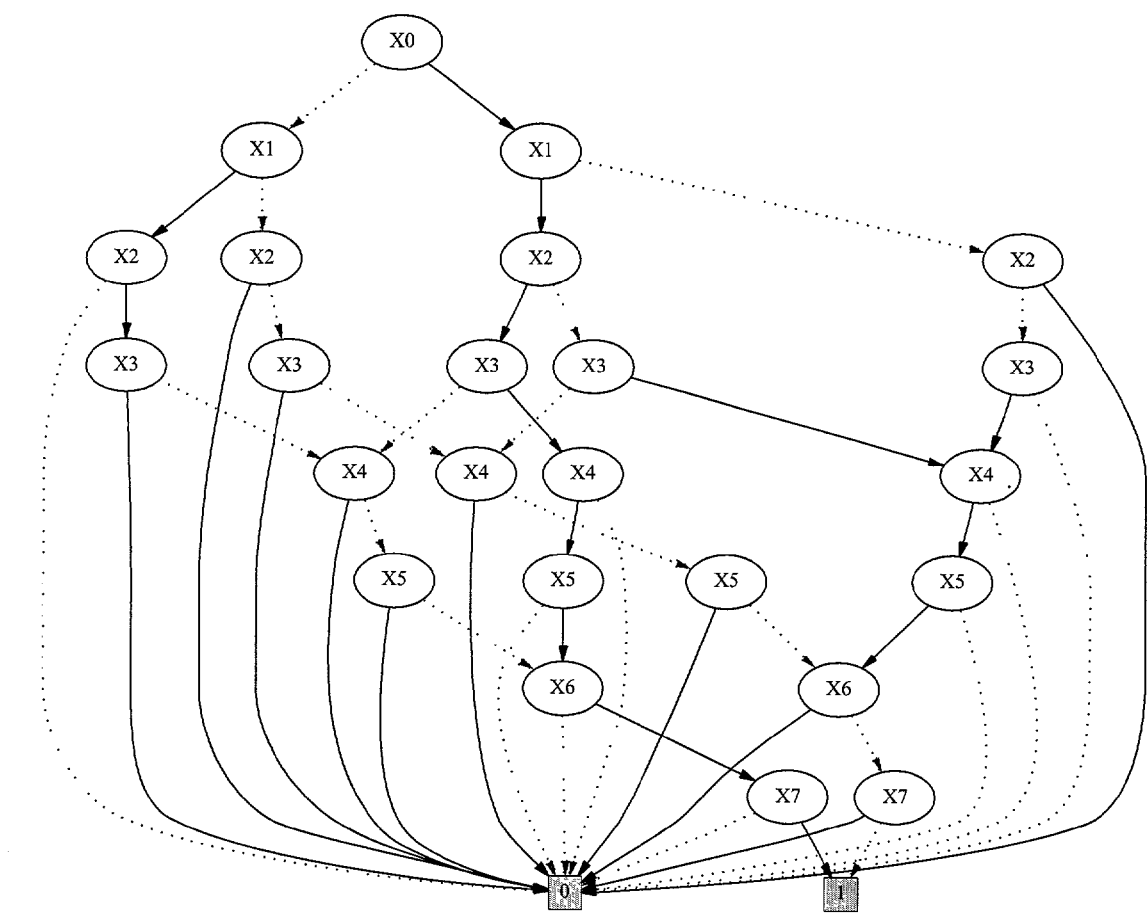
FIG. 6 shows another PC Example, exemplifying a BDD representing the rules.

FIG. 6 shows this BDD for the computer product. Notice that in this BDD it is in fact possible to select X0=1 and X1=1 and still reach the 1 terminal. This is caused by the fact that the domain constraints are not taken into account. A BDD containing all domain constraints $D_{all}$ is therefore built:

$$D_{all} \stackrel{def}{=} \bigwedge_{d \in D} d.$$

A BDD representing all possible consistent configurations is obtained by conjoining all the BDDs for all rules and all domain constraints.

$$C_{all} \stackrel{def}{=} R_{all} \land D_{all}.$$

Figure 7:
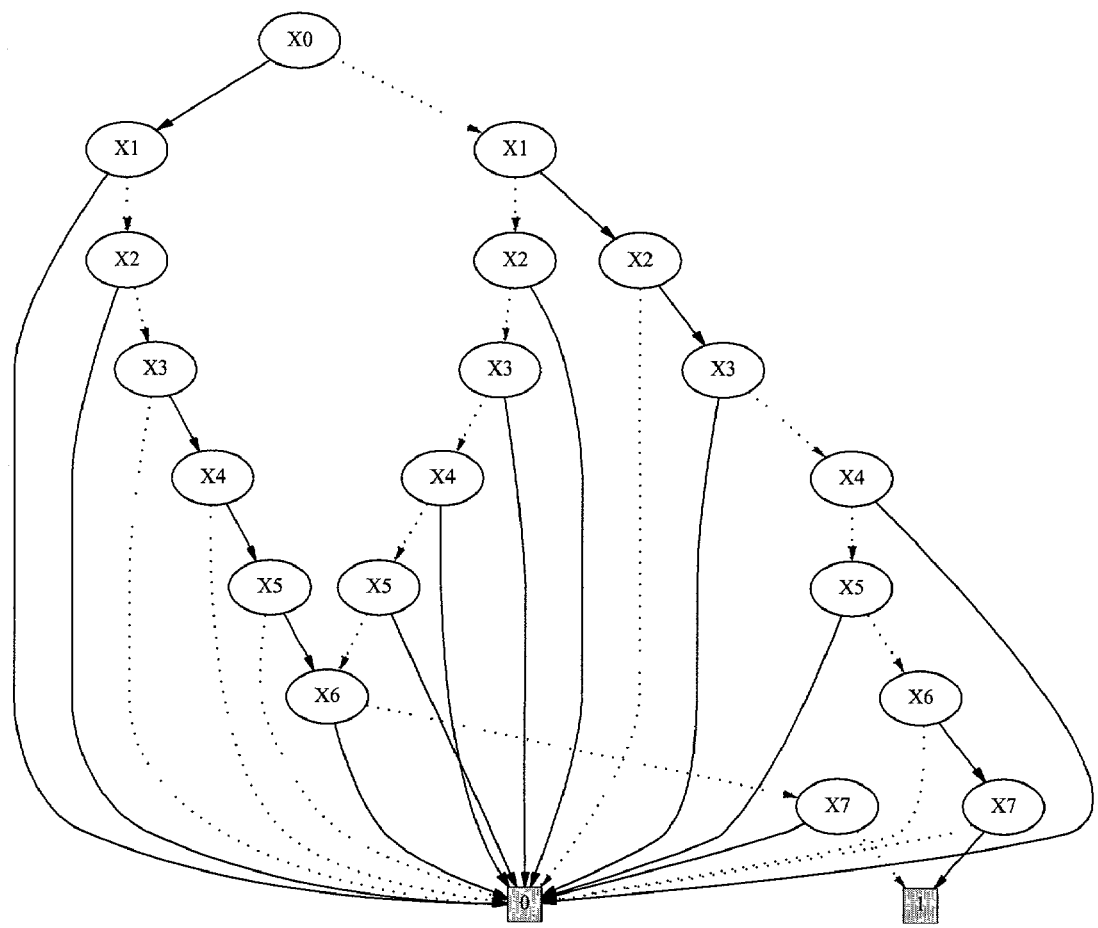
FIG. 7 shows another PC Example, exemplifying a BDD representing the rules and the domain constraints with both public and private variables included.

For the computer product model this BDD is shown in FIG. 7. Observe that exactly three different paths is containing all the variables lead to the terminal 1. Thus, for the computer product model exactly three consistent product configurations exists (one based on each of the different motherboards).

The preferred method of building $R_{all}$, $D_{all}$ and $C_{all}$ is by use of the algorithm MULTIAPPLY shown in Algorithm 2. Given an associative and commutative operator ⊕ and a set of vertices U={$u_1, \ldots, u_n$} the algorithm returns a BDD representing:

$$u_1 \oplus \ldots \oplus u_n.$$

As mentioned earlier only the public flattened variables are supposed to be available to the end user during configuration. It is possible to build a smaller BDD over only these variables without throwing necessary information away. This BDD is built by existentially quantifying out the set of private flattened variables (referred to as the set $V_{priv}$) preferably using the MULTIEXISTS algorithm shown in Algorithm 3 (Let $V_{priv}^B$ refer to the set of Boolean variables representing $V_{priv}$):

$$C_{pub} \stackrel{def}{=} \exists V_{priv}^B \cdot C_{all},$$

where we use ∃W on a finite set of variables W={$x_1, \ldots, x_m$} as a shorthand for m quantifiers: $\exists x_1 \ldots \exists x_m$.

Figure 8:
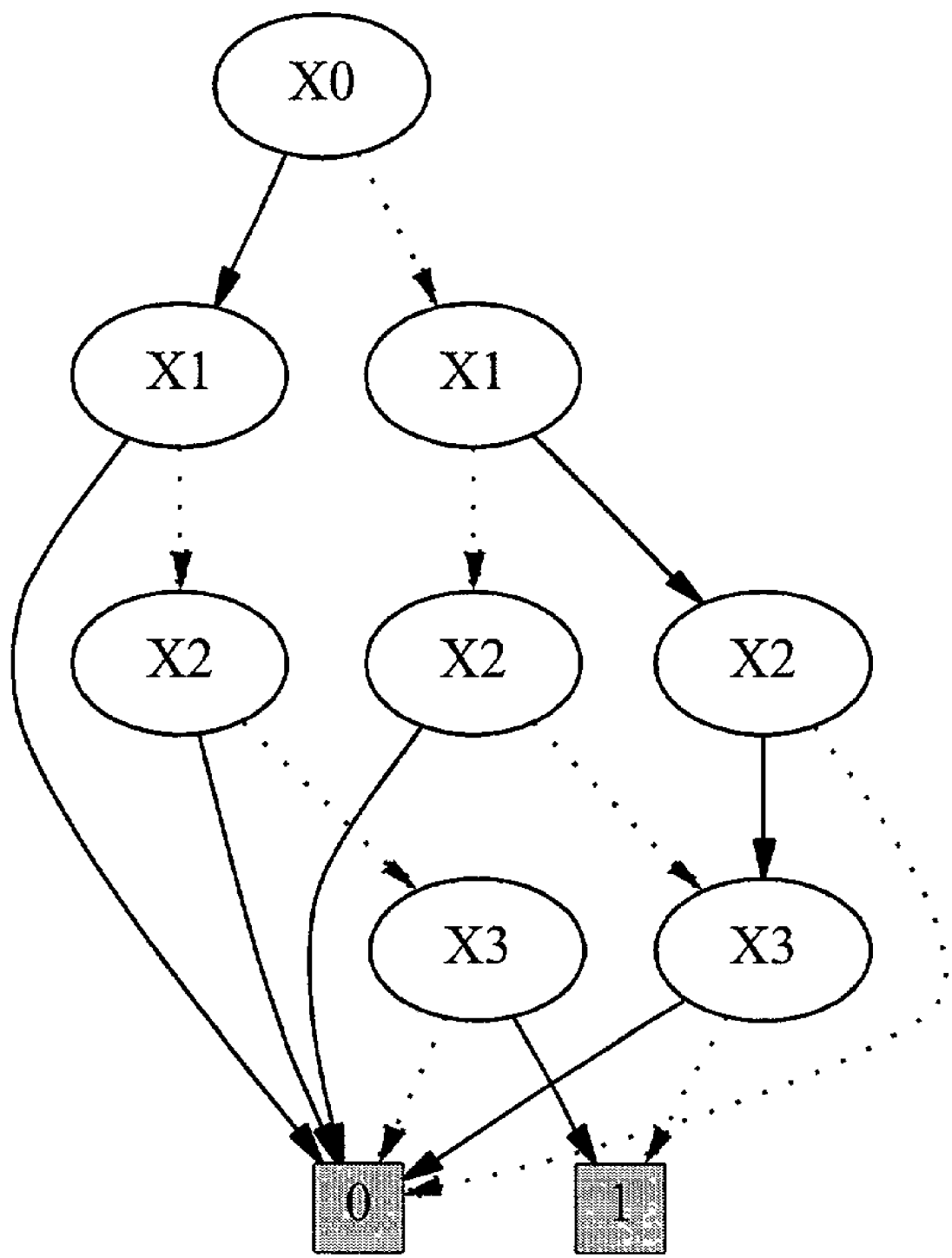
FIG. 8 shows another PC Example, exemplifying the virtual table with a BDD representing the rules and the domain constraints, and with only the public variables included.

For the computer product model the results is the BDD shown in FIG. 8. In the figure any path leading from the top vertex to the terminal 1 represents one or more assignments of Boolean variables that makes up a consistent configuration of the computer. More assignments are represented if some variables are absent on a path: these can take on any of the values 0 or 1 and still result in a consistent assignment. Using the symbol table it is possible to relate this information to the original flattened variables.

Early Quantification

For big product models it turns out that first building the BDD for the entire set of consistent configurations and thereafter quantifying out the private variables yields very big BDDs during the construction. A further advantage can be obtained by adapting a technique known as early quantification to the encoding process (see [J. R. Burch, E. M. Clarke, D. E. Long: i Symbolic Model Checking with Partitioned Transition Relations. Proceedings of the 1991 International Conference on VLSI]). The key observation is that if a variable is not free in a rule you can "move" the existential quantifier down below the conjunction in the conjunctive combination of the rules:

$$\exists x.(a \land b) = a \land (\exists x.b) \text{ if } x \text{ is not free in } a. \quad (1)$$

The preferred embodiment of the adaptation of this technique is as follows: A graph (V, E) is constructed comprising vertices V, each labelled with one flattened variable, and edges E, each labelled with one rule. The graph is undirected, but more than one edge can connect two vertices (a multigraph). The graph contains:

A vertex labelled v for each private flattened variable v. (This vertex will be referred to as the vertex v.)

For each pair of vertices v, w and rule r an edge between v and w if the flattened variables v and w are both free in r. (This edge will be referred to as the edge (v, r, w).)

Based on the constructed graph a strongly connected component graph is created (see for example: [Cormen, Leiserson, Rivest: *Introduction to Algorithms*, p. 488-490]). Let S denote the set of strongly connected components. Each of the strongly connected components comprises a sub-graph. Let $G_i=(V_i, E_i)$ comprise the i'th of these sub-graphs (for $1 \leq i \leq |S|$). $V_i$ is the private flattened variables in this sub-graph and $$R_i \stackrel{def}{=} \{r \mid (v, r, w) \in E_i\}$$

is the rules in this sub-graph.

Now, a private flattened variable in a graph $G_i$ is by construction not free in all rules not in $G_i$. Using the observation shown in Equation 1 this means (let $V_i^B$ be the Boolean variables representing $V_i$):

$$C_{pub} = \bigwedge_{i \in \{1,\ldots,|S|\}} \left( \exists V_i^B \cdot \left( \bigwedge_{r \in R_i} (D_{all} \wedge r) \right) \right).$$

An ordering of rules and flattened variables are now made by performing the following steps:

For each sub-graph $G_i$ choose an ordering of the flattened variables $V_i$ inherent in the sub-graph. Let $O_i$ denote the ordered list of these flattened variables.

Define an ordered list of all the flattened variables $$O \stackrel{def}{=} (O_1^\wedge \ldots^\wedge O_n) = \langle v_1, \ldots, v_{|V|} \rangle.$$

Sorting the rules based on the ordering O.

The last step is preferably performed by the algorithm ORDERRULES shown in Algorithm 4. This algorithm takes as input 1) the list of ordered flattened variables O and 2) the edges E. The call ORDERRULES (O, E) returns a list of sets of rules $F=\langle F_1, \ldots, F_{|V|} \rangle$ where invariantly:

$$\forall i,j \in \{1, \ldots, |V|\} : (i < j \to (v_i \cap freevars(F_j) = \emptyset)). \quad (2)$$

Now, combining Equation 1 and Equation 2 we can determine the set of consistent configurations $C_{pub}$ by 1) starting with a BDD for the domain constraints $D_{all}$, 2) repeatedly, for increasing i ($1 \leq i \leq |V|$), on this BDD first conjoining the rules in $F_i$ and thereafter quantifying out the Boolean variables representing $v_i$. This task is performed by the algorithm CONJOINEXISTS which is preferably implemented as shown in Algorithm 5. The set of consistent configurations is (where $O^B$ is the list of vectors of Boolean variables for the encoding of O, $\langle v_1^B, \ldots, v_{|V|}^B \rangle$):

$$C_{pub} = \text{ConJoinExists}(O^B, F, D_{all}).$$

In most BDD packages the number of declared variables are given at initialisation time, say n. Variables are then referred to using an index between 0 and n−1. The number of declared variables are used for example in the SATCOUNT algorithm. Even though the free variables of $C_{pub}$ only are among the public Boolean variables, we cannot just use SATCOUNT to count the number of consistent configurations. It would give us a number that is a factor $2^j$ to big, where j is the number of private Boolean variables. To get the correct number of consistent states we must either divide the result with this factor or, alternatively, we can re-initialise the BDD package with a declared number of variables equal to the number of public Boolean variables (we then need to re-encode the BDDs wrt. to the new variable indexes). We shall choose the latter approach.

Encoding Arithmetic Expressions

The computer product model does not contain any arithmetic operations. However, as described earlier, the preferred embodiment of the product model does allow certain carefully selected arithmetic expressions: addition of two expressions, subtraction of two operations, and multiplication of an expression with a constant. These arithmetic operations are allowed because 1) they turn out to be useful during product modelling and 2) at the same time efficient BDD operations for encoding such expressions exist.

The key observation is that during static expansion and just before the product model is encoded in Boolean form, all expression in all rules are Boolean combinations of these basic arithmetic operations as well as (in)equalities over the flattened variables. Using standard Boolean equivalences all rules can be written on a form generated by the following grammar (written on BNF form):

bexpr ::=bexpr ∧ bexpr (Conjunction)
 |¬bexpr (Negation)
 |aexpr bop aexpr (Arithmetic operator)
bop ::=<|≦|=|≧|>|≠ (Boolean operators)
aecpr ::=aexpr aop aexpr (Arithmetic operator)
 |constant|variable (Atomic arithmetic expression)
aop ::=+|−|*, (Arithmetic operators)

where constant represents a constant and variable represents a flattened variable.

It is well known how to encode these arithmetic operations in BDDs. Two reference are [Alan John Hu: *Techniques for Efficient Formal Verification Using Binary Decision Diagrams*, Ph.D. thesis, Stanford University, Department of Computer Science, Technical Report Number CS-TR-95-156] and [Jørn Bo Lind-Nielsen: *Verification of Large State/Event Systems*. Ph.D. Thesis., Department of Information Technology, Technical University of Copenhagen, IT-TR: 2000-032.]

Encoding Product Tables

As mentioned earlier a product table (typically represented in a database) can be used to represent a rule in an adequate manner. It is not necessary to first explicitly translate the product table to a textual rule and thereafter translate the rule into a BDD. Instead a BDD can be built directly from the product table.

The preferred embodiment for this process is the algorithm VIRTUALIZETABLE shown in Algorithm 6. The algorithm tabulates each cell, builds a BDD for this cell and accumulates the results of the tabulation in temporary BDD nodes. The auxiliary function VIRTUALIZECELL builds a BDD for a specific cell. The implementation of this algorithm will use the symbol table for finding out how to map flattened variables to Boolean variables.

Table filters are easily added to this method by adding information relating to the table filters to the symbol table and changing the auxiliary function VIRTUALIZECELL to use this information.

Encoding Sum Types

The computer product model contains values of enumerated type (for example [IDE|SCSI]). A more general type that can also be encoded using BDDs is the sum type (known from many classic type systems). This compound type allows a tag (as in the enumeration case) and a value (which can have any type). An example of a sum type modelling that an extra harddisk can either be absent or present (with a specific type) is:

variables:
    extraharddisk: [ABSENT|PRESENT of [IDE|SCSI]]

Possible values for extraharddisk are ABSENT, PRESENT (IDE) and PRESENT (SCSI). If we want to encode one of these values we must 1) capture whether we have selected the ABSENT or PRESENT tag and 2) in the latter case which sub-value (IDE or SCSI) we have selected. The preferred embodiment is to encode these two parts separately. In this specific case: One Boolean value (P) indicating that the extra harddisk is PRESENT and one Boolean variable (T) indicating that the type is SCSI.

Observe that using this encoding the value of T does not make sense if P=false. (Two different value assignments exist where P=false: P=false, T=false and P=false, T=true.) To limit the size of the representation and to be able to count the number of meaningful assignments we choose a default value for each sub-value. Then we define a normalisation constraint expressing that whenever this sub-value is not selected the sub-value must have the default value. For the extraharddisk example we choose the default value for T to false. Hence, the normalisation constraint is:

$(P=\text{false}) \rightarrow (T=\text{false})$.

Should such sum types occur all normalisation constraints must be conjoined on the BDD $C_{pub}$ for obtaining the final BDD representing the set of consistent configurations.

Interactive Configuration using the Virtual Table

The virtual table is now used for performing a configuration. Without limiting the invention a user is normally involved in this process. The user interacts with a computer program, a configuration assistant, interfacing to the virtual table. Generally, the configuration session performed by the user and the computer program can be viewed as an interactive iterative configuration where the configuration assistant guides the user through the configuration process:

the configuration assistant uses the virtual table to find information that is provided to the user, and
    the user provides information relating to his/her wishes.

The "protocol" for such a configuration session can be constructed in many ways. Without limiting the invention the session will typically be an iterative process comprising the following steps (seen from the perspective of the configuration assistant):

1. Inspecting the virtual table. The amount of information inherent in the virtual table is generally enormous. Therefore, the configuration assistant must be able to extract only limited amounts of information from the virtual table. Still, the provided information must be sufficient and relevant in the given context (where the context typically is earlier made selections.)
2. Providing the user with this information. This must be provided in a way so that the user is able to tell which options he/she has at the given time, and how selections will influence on the consistency of the configured product.
3. Allowing the user to make/undo selection(s). The configuration assistant has, at this stage, provided the user with information so that it is easy for the user to perform consistent selections, but it might be the case that the user anyway makes a selection incompatible with earlier selections. The configuration assistant must deal with all such cases in a reasonable manner. What is reasonable depends on the application. However, often the configuration assistant will have to sacrifice some earlier selections to, again, reach a consistent set of selections (informing the user of these sacrifices).
4. Using the virtual table for computing the consequences of the selections made by the user.

Figure 3:
FIG. 3 shows Interactive Configuration of a PC.

The iterative process goes on until the user decides to terminate the session. If a consistent and complete configuration has been found at this stage, it can be provided to an order placement system, etc. The communication between user and configuration assistant is performed through a user interface. FIG. 3 is a screenshot of a user interface for a pc product model. The user interface allows the user to see already performed selections (for example, the user has selected the alternative IBM DeskStar 25GP 10, 1 GB for the component Harddisk 1), see what alternatives that are available (here, by a "pop-up" window, currently showing CPU alternatives), and which of these alternatives that are compatible with all earlier selections (here, by using a black background colour). The user can select an alternative for a component, de-select earlier made configurations, etc. Two additional features make the life easier for the user:

A button (ConfigIt!) is provided for letting the configuration assistant finish off the configuration (by performing consistent selections of all unselected components) when the user has performed all selections he/she wishes.
    Other buttons allow the user to choose preconfigured selections, for example the pc shop's standard workstation. The user is afterwards still free to modify the workstation, and will still receive help from the configuration assistant.

A common case is to present such a user interface in a web browser, obviously allowing the use of the Internet for communication. The virtual table can either be placed on a virtual table server or on the client running the web browser. In the first case, the configuration assistant will comprise a server and a client thread (running in parallel, communicating through the Internet). In the second case, the configuration assistant will typically run solely inside the web browser. Both approaches are feasible and the method of deployment must be based on which properties are required for the given configuration session. However, the first approach is the preferred embodiment.

Recall that in our framework the components correspond to flattened product variables, and the alternatives correspond to values. Without limiting the invention the following pseudo code describes how the configuration assistant generally runs (obviously, the details can be handled in many ways: the exact commands available to the user can be different, the feedback from the system can differ, the order of many of the involved steps can be changed):

```
S ← ( )
repeat
  SHOWSTATUS(S)
  C ← READFROMUSER(S)
  if C = exit then
    return S
  end
  S ← UPDATESELECTION(S, C)
end
```

The variable S is an ordered list of selections, each selection comprising a pair (v, d) where v is a flattened variable and d is a flattened value. The selections generally represent a non-empty set of the consistent configurations available in the virtual table.

Initially no selections have been made, hence S is the empty list, representing the complete set of consistent configurations in the virtual table.

Information that can be obtained from S and the virtual table is now presented to the user. Typically, for each flattened variable the user is shown the possible selections that are compatible with S.

Now, the user is queried for a command C. The command can be the selection of one of the selections that were compatible with S, the de-selection of a selection already in S, the forcing of a selection, or, if a selection is made for all public flattened variables, exiting the configuration.

Based on the command C and the previous selections S a new selection list is computed as follows:

In the select case the new selection is compatible with S. The new selection is therefore simply added to the end of S. S will now represent a smaller (or equivalent) set of configurations.

In the de-selection of an earlier selection, the selection is simply removed from the list S. S will now represent a larger (or equivalent) set of configurations.

The force case of a selection is a bit more complex. Forcing means: "Even though this selection is not compatible with other selection force this selection, sacrificing other selections in S." A new S' is found by:

1. Adding the new selection to the front of S. (Recall, S is an ordered list.)
2. Initialising S' to a new empty list <>.
3. Starting from the front of S, for each selection s in S:
   If s is compatible with selections in S' add s to the end of S'.
   If s is incompatible with selections in S' throw s away.
4. The new selections are S'.

In the exit case we are finished and the consistent and complete configuration S is returned and for example passed on to an order placement system.

Even though details regarding the communication between the user and the configuration assistant are changed, it turns out that the basic algorithms on the virtual table for the implementation of the pseudo code are more or less the same. The following key algorithms are generally needed:

Algorithm(s) for combining a virtual table with one or more selections and for checking whether the combination is consistent.

An algorithm, that for a virtual table and a prioritised list of possibly inconsistent configurations, can determine which of the selections can be allowed and which of the selections will be "sacrificed" for making the selections consistent.

An algorithm that for a virtual table and some consistent selections determines consistent selections for all unselected components.

An algorithm for counting the number of consistent configurations for a given set of selections.

An algorithm that, for a variable, determines possible selections that are compatible with earlier selections.

These algorithms are generally implemented utilising the basic algorithms of the DAG in the virtual table (for the BDD case, the algorithms shown in Algorithm 1).

Preferred Embodiment for the Interactive Configuration

The preferred embodiment for the interactive configuration system is a configuration assistant comprising a server and a client thread running on a virtual table server and in a web browser, respectively. First, the preferred embodiments of key algorithms on the virtual table is provided. Thereafter, the server and client algorithms are presented.

The basic BDD algorithms utilises a programming technique known as dynamic programming. As a consequence results of computations on the BDDs are being cashed (depending on available memory, etc). This implies that a re-computation with the same arguments generally will run in constant time. A couple of the algorithms utilises this: Instead of maintaining tables with temporary BDDs the underlying operations are called (with the same arguments) and the result are (generally) available in constant time. This approach further more allows for the implementation of a "state-less" server.

The first four key algorithms concern the combinations of the virtual table and selections.

The first algorithm CONFIG1 shown in Algorithm 7 is used for combining the virtual table ($C_{atual}$) with one selection. The selection comprises a flattened variable v and a value d. First a BDD u is built, representing the selection. This BDD is build by 1) determining the Boolean variables $<v_1, \ldots, v_n>$ representing v and the Boolean values $<d_1, \ldots, d_n>$ representing d (by querying the symbol table), 2) for each pair $(v_i, d_i)$ of Boolean variables and values building a BDD for $(v_i=d_i)$, and 3) combining these BDDs using MULTI-APPLY ($\rightarrow$,.) obtaining one BDD. Thereafter, u is conjoined with the BDD representing the virtual table yielding a new BDD. This BDD is the set of consistent configurations respecting the original virtual table (representing, for example the rules of the product model) as well as the selection (v=d). Note, that the empty set of configurations is represented by the BDD 0. Thus, if the resulting BDD is 0, the virtual table is incompatible with the selection.

Figure 9:
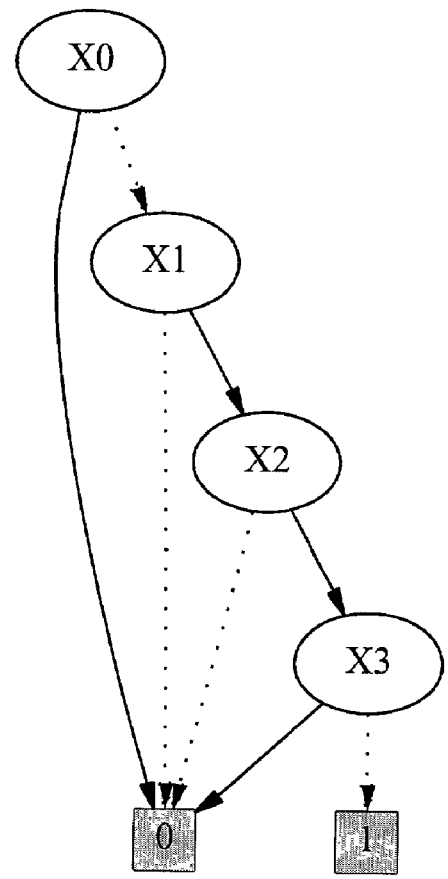
FIG. 9 shows another PC Example, exemplifying a BDD representing consistent configurations under the selection of the Seagate-Barracuda-9-9, 1 GB harddisk.

Recall the example computer product model discussed in the previous sections. In FIG. 8 the BDD representing the rules and the domain constraints was shown. The BDD representing the set of consistent configurations under the selection of the harddisk to Seagate-Barracuda-9-9, 1 GB can be determined by CONFIG1. The result is shown in FIG. 9. Note, that only one path leads to 1. This means that all other components are chosen implicitly by the selection of the harddisk. By inspecting the symbol table on page 29 it is easy to see that this correspond to the Aopen-AX6BP-ATX motherboard, the Seagate-Barracuda-9-9, 1 GB harddisk (of course), and the Intel-Celeron-A-366 MHz cpu.

The algorithm CONFIGCONSISTENT shown in Algorithm 8 builds a BDD representing several selections $S_{new}$. The algorithm simply applies CONFIG1 iteratively, yielding a BDD representing smaller and smaller sets of configurations. Note, that should the selections be incompatible the BDD returned is 0 and it is impossible to see "when" the problem occurred.

The algorithm CONFIGCHECK shown in Algorithm 9 takes care of this. The ordering of the selections in $S_{new}$ is used for prioritising selections. As in the previous algorithm CONFIG1 is applied to the individual selections. As long as the selections are consistent the selections are added to a list of consistent selections. However, should a selection turn out to be inconsistent with the earlier selections the selections is "rejected" and the previous set of configurations are kept. The rejected selections are put together in a list. When the algorithm are finished it returns a BDD representing a non-empty set of configurations. Under the (reasonable) assumption that the initial virtual table is non-empty this algorithm will invariantly return a BDD representing a non-empty set of configurations. The list of consistent and rejected selections is furthermore returned.

The next algorithm CONFIGIT shown in Algorithm 10 is used for 1) restricting the set of configurations based on a set of compatible selections and 2) automatically selecting compatible values for the remaining product variables. The algorithm starts of as CONFIGCONSISTENT yielding a BDD representing a non-empty set of solutions $C_{actual}$. Thereafter, the known BDD algorithm FULLONESAT is used. This algorithm builds a BDD comprising a single path in from $C_{actual}$. This BDD will represent exactly one configuration. The known BDD algorithm ANYSAT is then used to obtain the Boolean selections represented by this path. By "backwards" use of the symbol table the product selections is determined.

The next two algorithms are used for querying a virtual table.

The algorithm CONFIGCOUNT shown in Algorithm 11 counts the number of consistent configurations in a virtual table. The algorithm SATCOUNT is used to determine this number. However, three important details for being able to just return this number are:

1. In the preferred embodiment of the encoding of the virtual table domain constraints was conjoined on the virtual table. Without domain constraint, "illegal" paths would exists, yielding a wrong number of configurations.
2. In the preferred embodiment of the encoding of the virtual table all sum types were normalised. Without normalisations there would be more than one Boolean selections of variables for the value ABSENT (from the example on page 35) yielding a wrong number of configurations.
3. In the preferred embodiment of the encoding of the virtual table the BDD package was re-initialised after building the virtual table, thereby removing the private Boolean variables. In the case where the BDD package is not re-initialised it is necessary to divide the number obtained from SATCOUNT with $2^n$, where n is the number of private Boolean variables (obtained by inspecting the symbol table).

Using CONFIGCOUNT on the BDD representing the virtual table of the computer product model returns the number of consistent configurations of the computer, three. This number can also be found by counting the number of paths leading to 1.

The algorithm DETERMINEDOMAIN shown in Algorithm 12 determines, for a given flattened variable $v_i$ and a virtual table $C_{actual}$, which possible values can be selected. The algorithm works by existentially quantifying out all the Boolean variables X except for the Boolean variables $v_i^B$ representing $v_i$. The result of these existential quantifications is a BDD that—viewed from a configuration perspective—represents a virtual table. This virtual table has the nice property that it only contains one column (the column with the possible values for $v_i$). Since a product variable by virtue of the shape of the virtual table cannot have any interdependencies with other variables (only one column) the domain can be determined simply by listing the elements in the virtual table. This is done by: 1) Finding the set of assignments of the Boolean variables $v_i^b$ in the virtual table. 2) translating each of these to flattened values.

Figure 10:
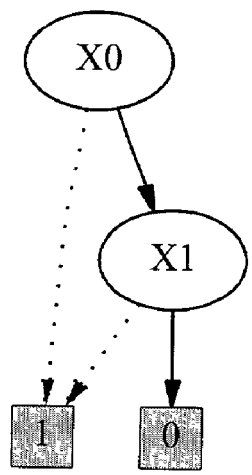
FIG. 10 shows show another PC Example, exemplifying the virtual table where all variables except X0 and X1 is existentially quantified out.

An illustrating example is to determine the domain of the motherboard-name flattened variable for the initial virtual table of the computer product model. The Boolean variables representing motherboard name is X0 and X1. All other Boolean variables are existentially quantified out yielding the BDD shown in FIG. 10 (structural equivalent to FIG. 5). This BDD has three assignments of Boolean variables X0 and X1: (0, 0), (0, 1) and (1, 0). By using the symbol table we can determine the corresponding flattened values.

The algorithms described above can be used to implement many different configuration systems. We will now show how they are used in a configuration assistant comprising a server and a client thread communication over a network such as the Internet. The virtual table is located on a virtual table server that performs the needed computations during configuration. A client is used for presenting a user with information regarding the configuration process and for querying about selections, etc.

The preferred implementation comprises the two threads CONFIGCLIENT (on the client side) and the algorithm CONFIGSERVER (on the server side). The two algorithms are shown in Algorithm 13 and Algorithm 14, respectively.

The CONFIGCLIENT runs during one configuration session. When the user has found a suitable configuration and wishes to stop the configuration session the algorithm returns with the obtained configuration. (The "return" is in real life typically replaced by sending the result to an order placement module, etc.)

The CONFIGSERVER algorithm is non-terminating. Upon start it enters a loop awaiting a client to serve. When it receives a configuration command from a client it computes a result and immediately returns this result to the client. Thereafter it loops back to start, awaits for a new command from a new client (or possibly the same), and so on.

Communication is specified using standard primitives such as SEND and RECEIVE. The protocol is that: Initially the client sends a configuration command to the server. The server receives this configuration command and computes the result. This result is passed back to the client. The client receives the result, provides information to the user and queries the user for a user command (a selection, exiting, etc.). Upon receiving this user command a new configuration command is send to the server, and so on.

The client is provided a single argument: the set of public flattened variables. The algorithm runs as follows.

1. First a configuration command is sent to the server, saying "provide me with information relating to the empty list of selections".
2. Thereafter information is received from the server comprising:

| | |
|---|---|
| $S_{actual}$ | A list of selections already made by the user. |
| $S_{rejected}$ | A list of selections rejected due to incompatibilities obtained through a Force operation (details follow). |
| N | The number of consistent configurations respecting the selections already made. |
| $(D_1,...,D_n)$ | For each public flattened variable $v_i$ the set of values that can be selected without reaching an inconsistent configuration. |

3. This information is presented to the user.
4. A command from the user is received I. The possible user commands are:
    Select (v, d). Add the selection of the public flattened variable v with value d (that is, the pair (v, d). The user interface must ensure that if v is the variable $v_i$, then d ∈ $D_i$ (hence, the selection leads to a consistent configuration).

Force (v, d). Add the selection of the public flattened variable v with value d. If the selection is inconsistent with an earlier selections s' the user wishes that s' is rejected.

Deselect (v). Remove the selection of the public flattened variable v.

Reset. Remove all selections.

PreConfigure (S). Remove all selections and instead pick a standard list of selections S (for example, a standard workstation.)

ConfigIt. For all public flattened variables where a value has not been selected let the configuration program pick any consistent selection.

Stop. Exit the interactive configuration. Let the server return the actual selections to the calling program, for example a order placement system. The user interface must ensure that the current selections comprises a complete selection (that is N must be 1).

5. Now, if the user command is Stop the algorithm terminates and returns the obtained selections.
6. Otherwise, a configuration command is constructed and sent to the server. Possible configurations command are:

Config(S). Command the server to compute information relating to the (possibly inconsistent) selections S. The selections S are constructed as follows:

For a Select user command the new selection is simply added to the end of the selection list.

For a Force user command the new selection is instead added to the front of the selection list: Should an inconsistency exists the force'd selection will be accepted and other selections (placed later in the list of selections) will be rejected.

For a Deselect user command the relevant flattened variable is simply removed from the selection list.

For Reset the new selection is empty.

For PreConfigure the new selection is a based on the standard list.

ConfigIt. Compute information relating to the consistent selections S. For all public flattened variables where a value has not been selected, pick any consistent selection.

7. Thereafter information is again received from the server and so on, see step 2.

The purpose of the server algorithm is to provide the computational needs for the client algorithm and can be viewed as glue code between the client and the key configuration algorithms described earlier. The server algorithm is provided the following arguments:

| | |
|---|---|
| $C_{basic}$ | The BDD $C_{pub}$ representing the virtual table. |
| $(v_1,...,v_n)$ | Th list of public flattened variables. |
| Y | The symbol table |

During computation the variable $S_{actual}$ is an (ordered) list of selections the user has made. Each of these selections comprises a pair (v, d) where v is a public flattened variable and d is a value from the domain of v. The BDD $C_{actual}$ represents all consistent configurations with respect to the actual selections $S_{actual}$.

The algorithms runs as follows:

The server receives a configuration command and an ordered list of selections $S_{new}$.

If the command is Config, $S_{new}$ might be inconsistent. Therefore, the algorithm CONFIGCHECK is used to build a set of consistent configurations and building the lists of accepted and rejected selections.

Alternatively, if the command is ConfigIt, $S_{new}$ is consistent, but remaining selections must be made. This is done using the CONFIGIT command.

Thereafter, the actual number of consistent configurations is determined.

And, for each variable, the actual possible values are determined.

The computed information is sent back to the server, and the algorithm loops awaiting a new command.

Finally, we will describe the preferred method of deployment of the configuration assistant on the Internet is as follows:

A user wishing to perform a configuration first connects to a web server.

The web server returns the implementation of CONFIGCLIENT to be executed in the user's browser (preferably implemented in Java Script).

When CONFIGCLIENT is initiated in the client web browser it connects to a virtual table server (not necessarily the web server) holding the virtual table and running the CONFIGSERVER algorithm.

The client and server threads communicates as described earlier.

---

Annex A: XML Document Type Declaration for the Product Description

```
<!-- DTD for ConfigIt projects - Copyright (C) 2000 ConfigIt -->
<!ELEMENT project (head, entities)>
<!ELEMENT head (name, description)>
<!ELEMENT entities ((constant | dbconstant)*, type*, productvariable*,
                                    (rule | dbrule)*, database?)>
    <!ELEMENT constant (name, description, expression)>
    <!ELEMENT dbconstant (name, description, sqlalias, filteralias, expression)>
    <!ELEMENT type (name, description, typeconstructor)>
        <!ELEMENT typeconstructor ((boolean | subrange | array | product |
                            sumtype | sumdb | idtype | label),
                            optional?)>
        <!ELEMENT boolean EMPTY>
        <!ELEMENT subrange (expression)>
        <!ELEMENT array (expression, typeconstructor)>
        <!ELEMENT product (prodvar*, (rule | dbrule)*)>
            <!ELEMENT prodvar ((private | public), name, description,
                            typeconstructor)>
            <!ELEMENT private EMPTY>
            <!ELEMENT public EMPTY>
```

-continued

```
        <!ELEMENT sumtype (sumvar*)>
            <!ELEMENT sumvar (name, description, typeconstructor)>
        <!ELEMENT sumdb (sqlalias, filteralias)>
        <!ELEMENT idtype (#PCDATA)>
        <!ELEMENT label EMPTY>
        <!ELEMENT optional EMPTY>
<!ELEMENT productvariable (name, description, (private | public),
                            typeconstructor)>
<!ELEMENT rule (name, description, expression)>
<!ELEMENT database (alias | sqlquery | filter)*>
    <!ELEMENT alias (name, description, dsn, username, password)>
        <!ELEMENT dsn (#PCDATA)>
        <!ELEMENT username (#PCDATA)>
        <!ELEMENT password (#PCDATA)>
    <!ELEMENT sqlquery (name, description, query, dbalias)>
        <!ELEMENT query (#PCDATA)>
        <!ELEMENT dbalias (#PCDATA)>
    <!ELEMENT dbrule (name, description, sqlalias, mapping*)>
        <!ELEMENT sqlalias (#PCDATA)>
        <!ELEMENT mapping (variable, lambdaexpr, lambdavar, column, filteralias)>
            <!ELEMENT variable (expression)>
            <!ELEMENT lambdaexpr (expression)>
            <!ELEMENT lambdavar (#PCDATA)>
            <!ELEMENT column (#PCDATA)>
            <!ELEMENT filteralias (#PCDATA)>
    <!ELEMENT filter (name, description, filterfunction, settings)>
        <!ELEMENT filterfunction (#PCDATA)>
        <!ELEMENT settings (number | true | false | string | numbers |
                            booleans | strings)*>
            <!ELEMENT string (#PCDATA)>
            <!ELEMENT numbers (number)*>
            <!ELEMENT booleans (true | false)*>
            <!ELEMENT strings (string)*>
<!ELEMENT name (#PCDATA)>
<!ELEMENT description (#PCDATA)>
<!ELEMENT expression (idconstructor | number | true | false | and | or |
    xor | imp | biimp | plus | minus | mult | lt | lteq | gr | greq | eq |
    neq | shftl | shftr | not | forall | exist | sum | prod | case | sumvalue
    if)>
    <!ELEMENT idconstructor ((idname, indexlist?) | (idconstructor,
                                                     idconstructor))>
        <!ELEMENT idname (#PCDATA)>
        <!ELEMENT indexlist (expression+)>
    <!ELEMENT number (#PCDATA)>
    <!ELEMENT true EMPTY>
    <!ELEMENT false EMPTY>
    <!ELEMENT and (expression, expression)>
    <!ELEMENT or (expression, expression)>
    <!ELEMENT xor (expression, expression)>
    <!ELEMENT imp (expression, expression)>
    <!ELEMENT biimp (expression, expression)>
    <!ELEMENT plus (expression, expression)>
    <!ELEMENT minus (expression, expression)>
    <!ELEMENT mult (expression, expression)>
    <!ELEMENT lt (expression, expression)>
    <!ELEMENT lteq (expression, expression)>
    <!ELEMENT gr (expression, expression)>
    <!ELEMENT greq (expression, expression)>
    <!ELEMENT eq (expression, expression)>
    <!ELEMENT neq (expression, expression)>
    <!ELEMENT shftl (expression | (expression, expression))>
    <!ELEMENT shftr (expression | (expression, expression))>
    <!ELEMENT not (expression)>
    <!ELEMENT forall (idname, range, expression)>
        <!ELEMENT range (expression, expression)>
    <!ELEMENT exist (idname, range, expression)>
    <!ELEMENT sum (idname, range, expression)>
    <!ELEMENT prod (idname, range, expression)>
    <!ELEMENT sumvalue (name, expression)>
    <!ELEMENT it (test, then, else)>
        <!ELEMENT test (expression)>
        <!ELEMENT then (expression)>
        <!ELEMENT else (expression)>
    <!ELEMENT case (idconstructor, pattern+, expression)>
        <!ELEMENT pattern (expression, expression)>
```

-continued

Annex B: Algorithms

Algorithm 1 function MK(x,h,l) : Var × V × V → V
    return (A vertex representing (x → h,l).)
function VAR(u) : V → Var
    return (If u represents (v → h,l), return v.)
function LOW(u) : V → V
    return (If u represents (v → h,l), return l.)
function HIGH(u) : V → V
    return (If u represents (v → h,l), return h.)
function APPLY($\otimes$ $u_1,u_2$) Operator × V × V → V
    return (A vertex representing ($u_1$ $\otimes$ $u_2$).)
function EXISTS(x,u) : Var × V → V
    return (A vertex representing ($\exists$x.u).)
function FULLONESAT(u) : V → V                       ▷u ≠ 0
    return (A BDD v (fullfilling: v → u) with exactly one satisfying assignment.)
function ANYSAT(u) V → (Var × B)-set           ▷u ≠ 0
    return (An assignments satisfying u.)
function SATCOUNT(u) : V → Z
    return (The number of value assignments for the BDD u.)
function MIN(V) Var-set → Var
    return (The variable v in V with lowest ordering: ($\forall$v' $\in$ (V − {v}) : v $\leq$ v').)
function MAx(V) : Var-set → Var
    return (The variable v in V with highest ordering: ($\forall$v' $\in$ (V − {v}) : v' $\leq$ v).)

Algorithm 2 function MULTIAPPLY ($\otimes$,U) : Operator × V-set → V     ▷ $\otimes$associative and commutative
    if U = {0} then
        return 0
    elsif U = {1} then
        return 1
    elsif U = {0, 1} then
        return 0 $\otimes$1
    else
        i = MIN({VAR(v) | v $\in$ U})
        V = {u $\in$ U | VAR(u) = i}
        U' = U − V
        L = {Low(v) | v $\in$ V}
        H = {HIGH(v) | v $\in$ V}
        return MK(i,MULTIAPPLY($\otimes$,H $\cup$ U'),MULTIAPPLY($\otimes$,L $\cup$ U'))
    fi

Algorithm 3 function MULTIEXISTS (X,u) Var-set × V → V
    if u $\in$ {0, 1}then
        return u
    elsif VAR(u) > MAX(X) then
        return u
    else
    h = MULTIEXISTS (X,HIGH (u))
    l = MULTIEXISTS (X, LOW(u))
    if VAR(u) $\in$ X then
        return APPLY(V,h,l)
    else
        return MK(VAR(u),h,l)
    fi
fi

Algorithm 4 function ORDERRULES(<$v_1$, ... ,$v_n$>,E):
                FlatVar-list × (FlatVar × Rule × FlatVar)-set → (Rule)-set-list
    for i ← 1 to n do
        $E_i$ = {($w_1$,r,$w_2$) $\in$ E | ($w_1$ = $v_i$ $\vee$ $w_2$ = $v_i$)}
        E = E − $E_i$
        $F_i$ = {r | ($w_1$,r,$w_2$) $\in$ $E_i$}
    end
    return <$F_1$, ... ,$F_n$>

Algorithm 5 function CONJOINEXISTS(<$v_i^B$, ... ,$v_n^B$>,<$F_1$, ... ,$F_n$>,u) : (Var-set)-list × (V-set)-list × V → V
                        ▷$\forall$i,j $\in$ {1, ... ,n} : (i < j => ($v_i$ $\cap$ freevars ($F_j$) = $\emptyset$))
    for i ← 1 to n do
        u = MULTIAPPLY ($\wedge$, {u} $\cup$ $F_i$)
        u = MULTIEXISTS($v_i^B$,u)
    end
    return u -continued Algorithm 6

```
function VIRTUALIZETABLE (T,Y) : Table × SymbolTable → V
    u ← 0
    foreach row i in T
        v ← 1
        foreach column j in T
            w ← VIRTUALIZECELL(T,i,j,Y)
            v ← APPLY(∧,v,w)
        end
        u ← APPLY(∨,u,v)
    end
    return u
function VIRTUALIZECELL (T,i,j,Y) : Table × Row × Column × SymbolTable → V
    return (a BDD representing $x_j^i = y_j$, $x_j^i$ is the cell at (row i, column j), $y_j$ is the label of column j.)
```

Algorithm 7

```
function CONFIG1($C_{actual}$, (v, d), Y) : V × (FlatVar × FlatVal) × SymbolTable → V
    u ← (A BDD representing the selection (v = d).)
    return APPLY(∧, $C_{actual}$,u)
```

Algorithm 8

```
function CONFIGCONSISTENT ($C_{basic}$,$S_{new}$,Y)
                              V × (FlatVar × FlatVal)-list × SymbolTable → V
    $C_{actual}$ ← $C_{basic}$
    foreach s ∈ $S_{new}$
        $C_{actual}$ ← CONFIG1($C_{actual}$,s,Y)
    end
    return $C_{actual}$
```

Algorithm 9

```
function CONFIGCHECK($C_{basic}$,$S_{new}$,Y) : V × (FlatVar × FlatVal)-list × SymbolTable →
                              (V × (FlatVar × FlatVal)-list × (FlatVar × FlatVal)-list)
    $C_{actual}$ ← $C_{basic}$
    $S_{actual}$ ← <>
    $S_{rejected}$ ← <>
    foreach s ∈ $S_{new}$                          ▷Must be "in-order" traversal.
        if CONFIG1($S_{actual}$,s,Y) ≠ 0 then
            $C_{actual}$ ← CONFIG1($S_{actual}$,s,Y)
            $S_{actual}$ ← $S_{actual}$ ^ s
        else
            $S_{rejected}$ ← $S_{rejected}$ ^ s
        fi
    end
    return ($C_{actual}$,$S_{actual}$,$S_{rejected}$)
```

Algorithm 10

```
function CONFIGIT($C_{basic}$,$S_{new}$,Y) : V × (FlatVar × FlatVal)-list × SymbolTable →
                              (V × (FlatVar × FlatVal)-list)
                              ▷$S_{new}$ must be consistent wrt. to $C_{Cbasic}$.
    $C_{actual}$ ← CONFIGCONSISTENT($C_{basic}$,$S_{new}$,Y)
                              ▷$C_{actual}$ ≠ 0
    $C_{actual}$ ← FULLONESAT($C_{actual}$)
    $S_{actual}^B$ ← ANYSAT($C_{actual}$)
    $S_{actual}$ ← ($S_{actual}^B$ translated to flattened variable selections by "backwards" use of Y.)
    return ($C_{actual}$,$S_{actual}$)
```

Algorithm 11

```
function CONFIGCOUNT(u) : V × Symboltable → Z
    return SATCOUNT(u)
```

Algorithm 12

```
function DETERMINEDOMAIN($C_{actual}$,$v_i$,{$v_i$, ... $v_n$},Y):
                              V × FlatVar × FlatVar-set × SymbolTable → FlatVal-set
    X ← $v_1^B$ ∪ ... ∪ $v_n^B$
    X ← X - $v_i^B$
    u ← MULTIEXISTS(X,$C_{actual}$)
    $D^B$ ← (The set of assignments of the Boolean variables $v_i^b$ in the BDD u.)
    D ← ($D^B$ translated to flattened values by "backwards" use of the symbol table Y.)
    return D
```

Algorithm 13

```
function CONFIGCLIENT({$v_1$,...$v_n$}) : FlatVar-set → (FlatVar × FlatVal)-set
    SEND(Config, <>)
    repeat
        RECEIVE($S_{actual}$,$S_{rejected}$,N,($D_1$,...,$D_n$))
        I ← SHOWSTATUSANDREADFROMUSER($S_{actual}$,$S_{rejected}$,N,($v_1$,...$v_n$),($D_1$,...,$D_n$))
        if I = Select(v,d) then            ▷∀i ∈ {1,...,n}.((v = $v_i$) → (d ∈ $D_i$))
```

-continued

```
        SEND(Config,STRIPSELECTION(S_actual,v)'(v,d))
    elsif I = Force(v,d) then
        SEND(Config,(v,d)'STRIPSELECTION(S_actual,v))
    elsif I = Deselect(v) then
        SEND(Config,STRIPSELECTION(S_actual,v))
    elsif I = Reset then
        SEND(Config,<>)
    elsif I = PreConfigure(S_new) then
        SEND(Config,S_new)
    elsif I = ConfigIt then
        SEND(ConfigIt,S_actual)
    else                                        ▷The selection must be complete.
        return S_actual                         ▷If we get here: I = Stop.
    fi
    end
(Unspecified functions: SHOWSTATUSANDREADFROMUSER, SEND, RECEIVE)
function STRIPSELECTION(S,v) :
            (FlatVar × FlatVal)-list × FlatVar → (FlatVar × FlatVal)-list
    return (S modified so that a possible selection relating to the variable v is removed.)
Algorithm 14 function CONFIGSERVER(C_basic,{v_1,...v_n},Y) : V × FlatVar-set × SymbolTable → ?
    repeat
        RECEIVE(C,S_new)
        if C = Config then
            (C_actual,S_actual,S_rejected) ← CONFIGCHECK(C_basic,S_new,Y)
        else
            (C_actual,S_actual) ← CONFIGIT(C_basic,S_new,Y)      ▷If we get here: C = ConfigIt.
            S_rejected ← <>
        end
        N ← CONFIGCOUNT(C_actual)
        for i ← 1 to n do
            D_i ← DETERMINEDOMAIN(C_actual,v_i,{v_1,...v_n},Y)
        end
        SEND(S_actual,S_rejected,N,(D_1,...,D_n))
    end
(Unspecified functions: SEND, RECEIVE)
```

The invention claimed is:

1. A method of configuring a product assisted by a computer comprising a number of components, the method comprising:

providing, for each component, information relating to a group of alternatives for the component, defining rules relating to compatibilities between alternatives from different components, representing the rules in a Directed Acyclic Graph (DAG), the DAG including at least one node having at least two pointers pointing to the node, and iteratively configuring the product assisted by the computer by repeatedly:

choosing a current component, when at least one of alternatives for the current component is selectable by a user, selecting selectable one of alternatives for the current component, checking the DAG whether the selected alternative is compatible with other selected alternatives of other chosen components, thereby the product being configured using all of the selected alternatives for all of the components, wherein the iterative configuring is ended when an alternative is chosen for each component and when the chosen alternatives of the components are compatible, and wherein the step of iteratively configuring the product further comprises:

for each pair of component and alternative providing a classification of the state of the pair, adopting the classification to one of a list of outcomes comprising blocked, selectable, user selected, system selected, or forceable, providing a classification of blocked when the alternative cannot be chosen for the component even without considering choices of alternatives for other components, providing a classification of selectable when the alternative for the component is compatible with the chosen alternatives from the other components, providing a classification of user selected when the alternative has already been chosen for the component, providing a classification of system selected when the alternative is the only choice for the component that is compatible with the chosen alternatives from the other components and the alternative has not been chosen by the user, providing a classification of forceable when the alternative can be chosen for the component but is incompatible with some of the other choices of alternatives of the other components, and providing information on the classification to the user.

2. The method according to claim 1, wherein the step of selecting the alternative, and before the selection of the alternative, comprises:

using the DAG to determine, for at least one of the components, a subset of alternatives for the component, so that each of the alternatives in the subset is compatible with the chosen alternatives from the other components, and providing information of the subset of alternatives for the component to the user.

3. The method according to claim 1, wherein the steps of choosing a component and the alternative further comprise, for each of the components:

using the DAG to check which of the alternatives of the component that are compatible with at least one of the chosen alternatives of each of the other components, providing the user with this information, allowing the user to select one of the alternatives that were compatible with at least one of each of the other component's chosen alternatives.

4. The method according to claim 1, wherein the steps of selecting the alternative and checking the DAG further comprise the steps of selecting or defining a subgroup of alternatives to the chosen component, checking the DAG for which of the alternatives in the subgroup that are compatible with chosen alternatives from other components, and providing information relating to which of the alternatives in the subgroup are compatible with chosen alternatives of other components.

5. The method according to claim 1, wherein the iterative configuration further comprises:

at least once, defining information relating to limiting the alternatives of at least one of the components, and checking the DAG for which of the alternatives of the components is compatible with the limiting information.

6. The method according to claim 1 in which the iterative configuring is ended upon request from the user, and information is provided relating to all possible compatible products comprising at least one chosen alternative for each of the products for which an alternative is chosen, and this information is provided to the user.

7. The method according to claim 1 in which the iterative configuring comprises the steps of obtaining a number of all possible compatible products comprising at least one chosen alternative for each of the products for which an alternative is chosen, and providing this information to the user.

8. The method according to claim 1, wherein the step of representing the rules in the DAG comprises representing the rules in a graph comprising:

at least one terminal node, a plurality of nodes comprising:

a mathematical expression having a plurality of possible disjoint outcomes and a number of pointers corresponding to the number of possible outcomes of the expression, wherein:

a pointer of at least one of the nodes points to another of the nodes, a pointer of at least one of the nodes points to one of the at least one terminal node, and at least one of the nodes being a top-most node from which one or more paths are defined from a top-most node to one of the at least one terminal node via one or more of the nodes and the pointers thereof, each node being part of at least one path.

9. The method according to claim 8, wherein the step of representing the rules in the DAG comprises providing one or more of the nodes with mathematical expressions each comprising a mathematical operator, each operator describing how the rules represented by the nodes pointed to by the pointers of the pertaining node are to be combined in order to represent the combined set of rules.

10. The method according to claim 8, wherein the step of representing the rules in the DAG comprises representing the rules in a DAG comprising a number of nodes, the mathematical expression of which is a Boolean expression.

11. The method according to claim 8, wherein the step of representing the rules in the DAG comprises representing the rules in a DAG comprising a number of nodes each comprising a mathematical expression which is a variable.

12. The method according to claim 8, wherein the step of representing the rules in the DAG comprises representing the rules in a DAG comprising nodes, the mathematical expressions of which are ordered according to a given ordering such that, for each node, the expression of the actual node is of a lower order than the expressions of any nodes pointed to by the pointers of the actual node.

13. The method according to claim 8 wherein the representing of the rules in the DAG further comprises the steps of:

identifying a first and a second node having the same expression and the pointers of which point to the same nodes, and having pointers pointing to the first node point to the second node.

14. The method according to claim 8, wherein the step of representing the rules the DAG comprises:

representing each rule as a logical expression, from each logical formula constructing a partial DAG representing the set of possible solutions to the formula, constructing the DAG representing all the rules from the partial DAGs representing each of the logical formulas.

15. The method according to claim 14, wherein the step of providing the information relating to the alternatives for each component comprises:

selecting Boolean variables for representing the individual alternatives of the component, providing an encoding for each of the alternatives of the component as a combination of Boolean values for the Boolean variables.

16. The method according to claim 15, wherein the step of representing each rule as a logical formula/expression comprises providing the Boolean variables relating to the alternatives to which the rule relates and interrelating the variables in accordance with the rule.

17. The method according to claim 8, wherein the step of representing the rules in the DAG comprises providing at least one type of terminal node and wherein, for each path comprising a such terminal node, the combination of all expressions and all pertaining outcomes relating to the pointers of the path relate to either compatible products or non-compatible products.

18. The method according to claim 17, wherein the step of representing the rules in the DAG comprises providing a first and a second type of terminal nodes, and wherein:

for each path comprising a terminal node of the first type, the combination of all expressions and all pertaining outcomes relating to the pointers of the path relate to a compatible products, and for each path comprising a terminal node of the second type, the combination of all expressions and all pertaining outcomes relating to the pointers of the path relate to a non-compatible products.

19. The method according to claim 18, wherein the first type of terminal node is adapted to represent "true", "one" or "1", and wherein the second type of terminal node is adapted to represent "false", "zero" or "0".

20. The method according to claim 18, wherein the step of representing the rules in the DAG comprises:

representing each rule as a logical expression, from each logical formula constructing a partial DAG representing the set of possible solutions to the formula, constructing the DAG representing all the rules from the partial DAGs representing each of the logical formulas, the step of providing the information relating to the alternatives for each component comprises:

selecting Boolean variables for representing the individual alternatives of the component, providing an encoding for each of the alternatives of the component as a combination of Boolean variables, and the step of selecting an alternative comprises:

identifying Boolean variables relating to the other alternative(s) of the component and nodes comprising expressions relating to such other alternative(s), and in the DAG, identifying paths comprising such nodes and altering any terminal node(s) thereof of the first type to terminal node(s) of the second type.

21. The method according to claim 18 in which the step of iteratively configuring the product comprises the steps of:

obtaining a number of all possible compatible products comprising at least one chosen alternative for each of the products for which an alternative is chosen, providing this information to the user, and wherein the computing of the number of possibilities of different choices is performed by the following steps applied to the DAG and for each top-most node:

starting from the topmost node and iteratively finding the number of possibilities represented by the actual node, by performing the steps of:

if the node is a terminal node, providing a "1" if the terminal node is of the first type and a "0" if it is of the second type, else: finding the number of possibilities represented by each node pointed to by a pointer of the actual node, and therefrom computing the number of possibilities represented by the node.

22. The method according to claim 1, wherein, the step of checking the DAG further comprises, if the selected alternative is not compatible with other chosen alternatives, providing information relating to other chosen alternatives which are not compatible with the selected alternative, and providing this information to the user.

23. The method according to claim 1, wherein the step of defining the rules comprises:

obtaining, by querying a database, information relating to alternatives relating of one or more components and/or information relating to compatibility between two or more alternatives to different components, and building one or more rules from the information obtained from the database.

24. The method according to claim 23, wherein the database comprises a two-dimensional table having, in each of a plurality of rows thereof, information relating to the product comprising an alternative from each component, the alternatives being compatible, wherein the step of providing a rule comprises providing a rule relating to the information of each row, and wherein the step of representing the rules in the DAG comprises providing a disjunction of the rules.

25. The method according to claim 8, wherein the step of checking the DAG whether an alternative is compatible comprises searching the DAG for a path from a topmost node to a terminal node, the search comprising:

starting with the top-most node as an actual node, iteratively, until the actual node is a terminal node:

evaluating the mathematical expression in the actual node and determining the outcome thereof in view of the alternatives chosen from other components, selecting the pointer of the node representing the outcome, selecting, as the actual node, the node pointed to by the selected pointer, providing information relating to the chosen alternatives, and the information relating to the path represents that the choices are compatible.

26. The method according to claim 18, wherein information is provided from a path in the DAG by providing, from the expressions of the nodes of the path, information relating to which alternative(s) of a given component has/have been chosen, and the information of compatibility of the product comprising those alternatives is given by the representation of the terminal node of the path.

27. The method according to claim 26, wherein the expressions of nodes of the DAG are Boolean variables, the terminal nodes represent either "true" or "false", the information of a path relating to the identities of the variables in the mathematical expression(s) of the node(s) of the path and values or dependencies thereof, the identities and values and dependencies relating to chosen alternatives of components, the chosen components being compatible if the terminal node of the path represents "true" and the chosen components being incompatible if the terminal node of the path represents "false".

28. The method according to claim 8, wherein the step of representing the rules in the DAG comprises:

representing the rules in an actual DAG, selecting at least one of the components to be hidden, changing the actual DAG by:

identifying nodes in the actual DAG comprising expressions relating to the selected component(s), removing these nodes from the actual DAG, adding nodes, not comprising expressions relating to the selected component(s), to the actual DAG so that the compatibilities implied by these component(s) are reflected by the actual DAG, providing the actual DAG as the DAG representing the rules.

29. The method according to claim 8 wherein the step of representing the rules in the DAG comprises:

for each of the rules, constructing a partial DAG representing the rule, identifying at least one of the components to be hidden, selecting an ordering of the identified components, initially constructing an actual DAG representing no rules, and then repeatedly, selecting a non-selected component of lowest order, repeatedly, until all partial DAGs comprising expressions relating to the selected component have been chosen:

choosing a partial DAG comprising expressions relating to the selected component, combining the actual DAG with the chosen partial DAG into a new actual DAG, changing the actual DAG by:

identifying nodes in The actual DAG comprising expressions relating to The identified component, removing these nodes from the actual DAG, adding nodes, not comprising expressions relating to the identified component, to the actual DAG so that the compatibilities implied by the identified component are reflected by the actual DAG, providing the DAG by combining the actual DAG with all non-chosen partial DAGs.

30. The method according to claim 1, the method further comprising:

performing the step of selecting an alternative of a component by the user through communication between a device controlled by the user and another device where the iterative configuration is performed, transmitting information relating to the checking of the DAG to the user.

31. The method according to claim 1, wherein the method further comprises:
   identifying the user,
   prior to the iterative configuring:
      transmitting the DAG to a device controlled by the user,
      performing the iterative configuring on the user's device.

32. The method according to claim 1, further comprising the steps of, during the iterative configuration:
   obtaining information relating to one or more alternatives for components for which no alternatives have been chosen, each of the one or more alternatives being compatible with the chosen alternatives, and
   providing the user with this information.

33. The method according to claim 1, wherein the method further comprises identifying a configurable device and an interface device, and
   storing the DAG representing the rules on the configurable device,
   uploading the DAG from the configurable device to the interface device, and
   in the step of iteratively configuring the product, performing the checking of the DAG whether the alternative selected is compatible with other chosen alternatives from other components on the interface device.

34. The method according to claim 33 wherein the method further comprises identifying a list of predetermined components in the configurable device and identifying a list of predetermined alternatives for these components in the configurable device, and wherein the step of iteratively configuring the product further comprises
   performing the checking of the DAG whether the alternative selected is compatible with other chosen alternatives from other components and compatible with the predetermined alternatives on the interface device.

35. The method according to claim 1, wherein the method further comprises identifying a list of observer components and a list of non-observer components, and
   representing the rules for the non-observer components in a DAG,
   determining, for each observer component, a subset of the rules, such that from these rules it is possible to determine the alternatives for the observer component that are compatible with alternatives for the non-observer components,
   representing for each observer component the subset of rules as an observer DAG, and
   in the step of iteratively configuring the product
      checking the DAG whether the alternative selected is compatible with other chosen alternatives from other components,
      determining a set of system determined alternatives by determining for each component whether there is only a single alternative compatible with all the chosen alternatives,
      for at least one of the observer components, checking the observer DAG for the observer component to determine whether there is only a single alternative compatible wit other chosen alternatives and the set of system determined alternatives, and
      providing this information to the user.

36. The method according to claim 1, wherein the DAG has at least one path from a topmost node to a bottommost node satisfying all of the rules in the DAG, each of the components having one alternative in the at least one path such that the alternative of each of the components in the at least one path is compatible with each other.

37. The method according to claim 1, wherein at least one of the alternatives of the current component is compatible with the other selected alternatives respectively for the other chosen components and is compatible with at least one of the alternatives in each of yet-to-be-chosen components.

38. The method according to claim 1, wherein the rules represented in the DAG is defined to guarantee that when one of the alternatives is selected for a first one of the components, at least one product configuration exists by using the selected one of the alternatives for the first one of the components and using one of the alternatives for each of the other components.

* * * * *